(12) United States Patent
Takahashi et al.

(10) Patent No.: US 6,618,692 B2
(45) Date of Patent: Sep. 9, 2003

(54) REMOTE DIAGNOSTIC SYSTEM AND METHOD FOR SEMICONDUCTOR MANUFACTURING EQUIPMENT

(75) Inventors: Kazue Takahashi, Kudamatsu (JP); Nobuo Tsumaki, Ushiku (JP); Hideyuki Yamamoto, Kudamatsu (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/791,761

(22) Filed: Feb. 26, 2001

(65) Prior Publication Data

US 2002/0035447 A1 Mar. 21, 2002

(30) Foreign Application Priority Data

Sep. 20, 2000 (JP) ........................................ 2000-284871
Sep. 22, 2000 (JP) ........................................ 2000-289304

(51) Int. Cl.[7] ................................................ G06F 11/30
(52) U.S. Cl. ........................................ 702/188; 702/183
(58) Field of Search ................................ 702/188, 189, 702/183, 184, 81, 182; 340/286.07; 438/14; 706/46, 47

(56) References Cited

U.S. PATENT DOCUMENTS 5,787,234 A  *  7/1998  Molloy ........................ 706/46
6,377,162 B1 *  4/2002  Delestienne et al. ... 340/286.07
6,405,144 B1 *  6/2002  Toprac et al. ................. 438/14
6,510,350 B1 *  1/2003  Steen et al. ..................... 700/9

FOREIGN PATENT DOCUMENTS

JP          9-149188        6/1997
JP          10-40200        2/1998

* cited by examiner

Primary Examiner—Marc S. Hoff
Assistant Examiner—Paul Kim
(74) Attorney, Agent, or Firm—Antonelli, Terry, Stout & Kraus, LLP

(57) ABSTRACT

A remote diagnostic system for semiconductor manufacturing equipment which diagnoses user's semiconductor manufacturing equipment connected to a piece of diagnostic equipment which is provided by a third party through a communication network. The diagnostic equipment having at least one diagnostic program which diagnoses said semiconductor manufacturing equipment and a control section which starts the diagnostic program when accessed by a specific user terminal which has been given an access right, and the terminal sends data which is requested by the diagnostic equipment for diagnosis and receives a result of diagnosis from the diagnostic equipment.

9 Claims, 20 Drawing Sheets

FIG. 7

LOT RECORD

| LOT NUMBER | 123 |
|---|---|
| CASSETTE NUMBER | 2 |
| START TIME | 2000/9/10 10:15:38 |
| LOT NAME | LOT 12345test |
| PROCESS NAME | Pat |
| OPERATOR NAME | Takahashi |
| RECIPE NUMBER | 1 |
| PROCESS RECIPE | Kazue0123 |
| NUMBER OF WAFERS LOADED | 25 |
| NUMBER OF WAFERS UNLOADED | 25 |

[ETCHING CHAMBER]

| ITEM | UNIT | | | | | | |
|---|---|---|---|---|---|---|---|
| WAFER NUMBER | | 1 | | | 2 | | |
| STEP NUMBER | | 1 | 2 | 3 | 1 | 2 | 3 |
| STEP TIME | s | 70 | 30 | 95 | 70 | 30 | 95 |
| JUST-ETCHING TIME | s | 71 | 30 | 94 | 70 | 29 | 95 |
| PROCESSING PRESSURE | Pa | 2.034 | 4.054 | 2.027 | 2.034 | 4.041 | 2.021 |
| OPENING OF PRESSURE REGULATING VALVE | % | 54.9 | 15.7 | 55.4 | 54.9 | 15.7 | 55.5 |
| GAS 1 FLOW RATE | ml/min | 1001 | 199 | 1001 | 1001 | 199 | 1001 |
| GAS 2 FLOW RATE | ml/min | 0 | 0 | 0 | 0 | 0 | 0 |
| GAS 3 FLOW RATE | ml/min | 201 | 102 | 203 | 200 | 100 | 201 |
| GAS 4 FLOW RATE | ml/min | 15 | 0 | 15 | 15 | 0 | 15 |
| SUPPLIED SOURCE POWER | W | 1005 | 905 | 1005 | 1005 | 905 | 1005 |
| REFLECTION POWER | W | 7 | 3 | 7 | 5 | 3 | 7 |
| SOURCE POWER STB1 | % | 21 | 25 | 21 | 22 | 25 | 22 |
| SOURCE POWER STB2 | % | 72 | 73 | 72 | 72 | 73 | 71 |
| SOURCE POWER STB3 | % | 100 | 100 | 100 | 100 | 100 | 100 |
| WAFER BIAS POWER | W | 1799 | 400 | 1800 | 1800 | 400 | 1800 |
| REFLECTION POWER | W | 0 | 0 | 0 | 0 | 0 | 0 |
| WAFER BIAL Vpp | V | 1571 | 923 | 1561 | 1561 | 914 | 1561 |

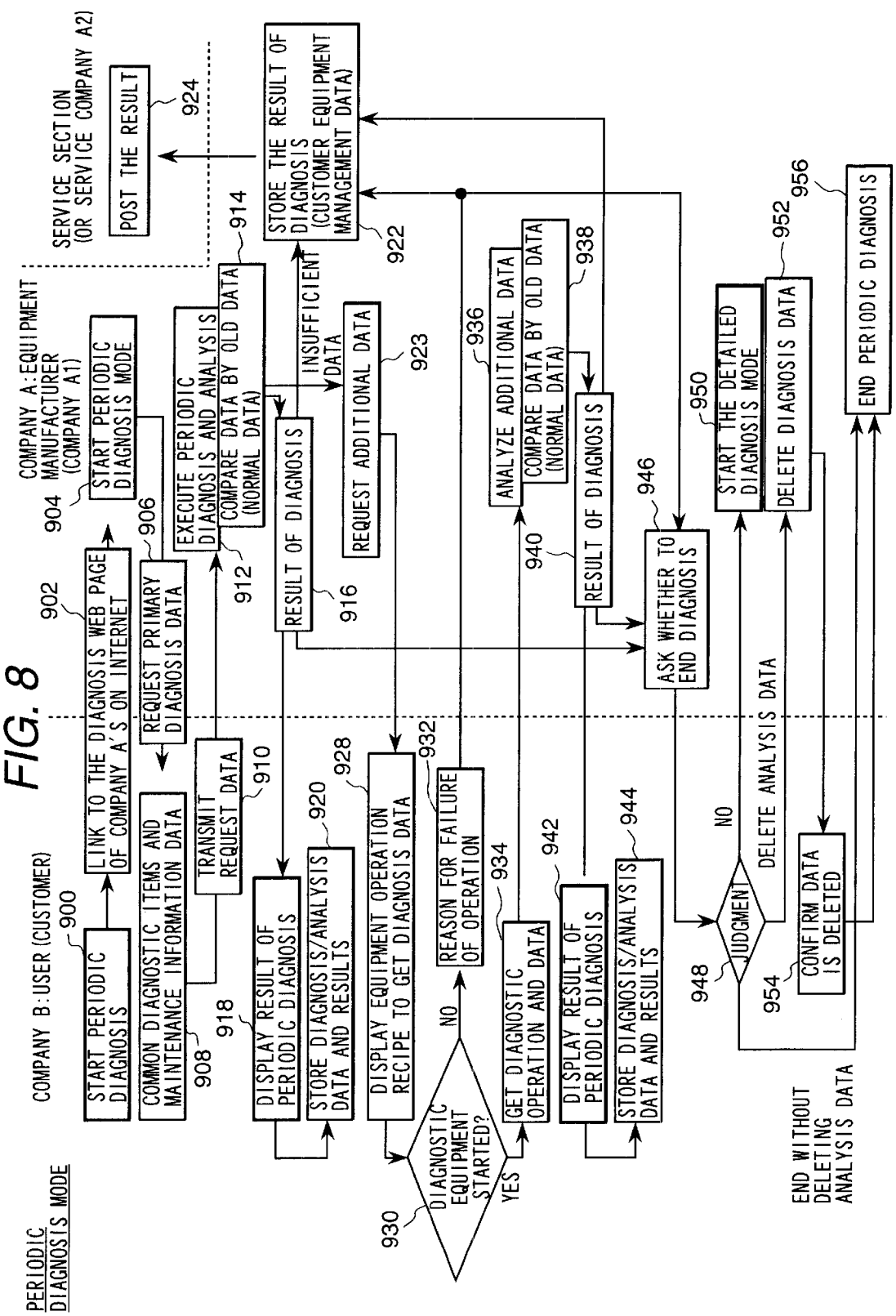

REMOTE DIAGNOSTIC SYSTEM AND METHOD FOR SEMICONDUCTOR MANUFACTURING EQUIPMENT

BACKGROUND OF THE INVENTION

The present invention relates to a remote facility agnostic system and a diagnostic method thereof; more particularly, the invention relates to a remote facility agnostic system and a diagnostic method for use when the manufacturer and the user of a facility, such as semiconductor manufacturing equipment, are different. In this specification, "facility" means not only a manufacturing facility, such as semiconductor manufacturing equipment, but also a combination of apparatus or components, such as a large-scale medical system.

Recently, a variety of apparatus equipped with a remote diagnostic function, using the Internet and the like, have been proposed. For example, Japanese Non-examined Patent Publication No. 10-40200 (1998) discloses a remote diagnostic function which transfers various kinds of data set by a terminal station to a piece of remote diagnostic equipment in a center station of a service company to ask the center station to start a remote diagnosis according to the data sent from the terminal station, and the terminal station then receives new corrected data.

Further, this Japanese Non-examined Patent Publication No. 10-40200 (1998) also discloses a method of troubleshooting an apparatus connected to a terminal in a computer network or an apparatus including said terminal as a technology which enables initialization, troubleshooting, data update, and so on of said apparatus. A system using this technology is so constructed that said apparatus may send its status data to said terminal, that said terminal may transfer the received status data to a server on the Internet, and that said server may diagnose said apparatus according to the received status data and return the result of diagnosis to said terminal.

Such a remote diagnostic system must be protected against unauthorized accesses from the outside. If said system is not protected, confidential data of the provider and the user of said remote diagnostic function may be read involuntarily.

Japanese Non-examined Patent Publication No. 9-149188 (1997) aims to provide a remote diagnostic system for communication equipment which is protected against unauthorized accesses. In said remote diagnostic system, the apparatus in the center station is equipped with a data generation means which creates data from an ID number set by an apparatus in the terminal station and sends the created data to the apparatus in the terminal station. Further, the apparatus in the terminal station is equipped with means for setting and sending an ID number to said apparatus in the center station, means for analyzing received data, and diagnosis control means for enabling or disabling the remote diagnosis.

Another known remote diagnostic system comprises apparatuses connected to a LAN, an information processing unit, and diagnostic equipment on a network. Each apparatus is assigned an Internet Protocol (IP) address. In this case, since said information processing unit and said diagnostic equipment are connected in parallel to the LAN, not only the maintenance and diagnostic equipment, but also other equipment can access the information processing unit. Therefore, user data may be easily accessed by third parties. To solve such a problem, Japanese Non-examined Patent Publication No. 9-149188 (1997) discloses a remote maintenance and diagnosis system wherein the maintenance and diagnostic equipment which is connected to the information processing unit to monitor the operating status of the system has a network connection function and an autonomous network function, such as a monitoring and analyzing function, and said information processing unit is connected to the network by said maintenance and diagnostic equipment. This system improves the system security and reduces the system installation cost.

As the technologies become more advanced and more complicated, it becomes harder for a single company to manufacture and manage a large-scale facility, such as a semiconductor manufacturing line, which comprises various semiconductor manufacturing units dedicated for each semiconductor manufacturing process. Therefore, for high-precision diagnosis and quick repair of such large-scale facilities, it is necessary to collect information about the related manufacturers, users, and the maintenance of the facilities from companies and so on.

However, these kinds of information include confidential data of the companies. Therefore, provision of such information is highly limited. The recent facilities for production and management have been more and more centralized and intensive. If a semiconductor manufacturing line, for example, is disabled, it is very urgent to investigate the cause of the trouble and repair the line. If this emergency measure is delayed, economic losses may be greater.

Further, it is preferable to estimate possible failures in such facilities in advance and take some steps before they actually occur. This is the best way to prevent economic losses.

However, it takes much time to collect or create data required for diagnosis of semiconductor manufacturing equipment. For example, we cannot directly determine the life of a pressure gauge (or required calibration timing of the gauge) because it is dependent upon the operating conditions and environment. Naturally, it is sometimes impossible for the manufacturer of said semiconductor manufacturing equipment to provide a fast and high-precision diagnostic program for the equipment from the beginning. Usually, faster and higher precision diagnostic programs will be provided by the manufacturer after the facility is installed.

It is assumed that the use of a highly analytical result, such as the use of statistical analysis and optical analysis (OES) and a plasma impedance monitor (PIM) will be very useful to jobs such as detection of process changes and adjustment of machine differences which have been conducted by customer's engineers. In other words, these kinds of data indicating the status of semiconductor manufacturing equipment are essential to the users, but have not been used for conventional diagnosis of semiconductor manufacturing equipment. If these kinds of highly analytical data are made available to the users, efficient diagnoses will be possible. In this case, the users are requested to partially pay for development of this kind of highly analytical diagnosis software.

SUMMARY OF THE INVENTION

An object of the present invention is to provide a remote diagnostic system and a remote diagnostic method which have the aim of both high security of information and prevention of economic losses in remote diagnosis of facilities.

Another object of the present invention is to provide an environment which can present diagnostic programs of higher function and higher quality to the user even after the facilities are installed.

A further object of the invention is to provide a remote diagnostic system and a remote diagnostic method which estimates possible failures in facilities in advance and takes some steps before they actually occur so as to prevent the economic losses due to such failures.

A still further object of the present invention is to provide a remote diagnostic system and a method thereof, which enables the users to carry out with high-reliability diagnoses using highly analytical data, and further eases the economical burden on the developer of the diagnostic software.

The present invention is characterized by a remote diagnostic system for semiconductor manufacturing equipment which diagnoses user's semiconductor manufacturing equipment connected to a piece of diagnostic equipment which is provided by a third party through a communication network. Said diagnostic equipment comprises at least one diagnostic program which diagnoses said semiconductor manufacturing equipment and a control section which starts said diagnostic program when accessed by a specific user terminal that has been given an access right. Said terminal sends data which is requested by said diagnostic equipment for diagnosis and receives a result of diagnosis from said diagnostic equipment.

Another object of the present invention is to provide a remote diagnostic system for diagnosing a facility under the control of a first company by using a piece of diagnostic equipment of a second company, which is not under the control of said first company, wherein said diagnostic program comprises at least one diagnostic program which diagnoses said facility and a control section which starts said diagnostic program when accessed by a specific user terminal that has been given an access right, and wherein said terminal sends data which is requested by said diagnostic equipment for diagnosis and receives a result of diagnosis from said diagnostic equipment.

The present invention can provide a remote diagnostic system which aims to achieve both high security of information and prevention of economic losses in the remote diagnosis of facilities.

A more particular object of the invention is to provide a remote diagnostic system for semiconductor manufacturing equipment which diagnoses semiconductor manufacturing equipment connected to a piece of diagnostic equipment which is provided by a third party through a communication network; wherein said diagnostic equipment comprises a plurality of diagnostic programs which diagnose said semiconductor manufacturing equipment, a control section which starts a diagnostic program when accessed by a specific user that has been given an access right, and a guidance section which displays information about said diagnostic programs.

The present invention can provide an environment which can present diagnostic programs of higher function and higher quality to the user even after facilities are installed.

The present invention is further characterized in that said diagnostic program comprises a periodic diagnosis program which periodically diagnoses said semiconductor manufacturing equipment, an abnormal mode diagnosis program which temporarily diagnoses said semiconductor manufacturing equipment when said semiconductor manufacturing equipment has a problem, and a troubleshooting program which diagnoses when the problem of said semiconductor manufacturing equipment is partially located.

The present invention can provide a remote diagnosing system and a remote diagnosing method which can estimate possible failures in such facilities in advance and take some steps before they actually occur using said periodic diagnosis program. The present invention is effective to prevent the economic losses of facilities.

The present invention is further characterized in that a remote diagnostic system for semiconductor manufacturing equipment which diagnoses user's semiconductor manufacturing equipment connected together with a terminal to a piece of diagnostic equipment which is provided by a third party through a communication network, comprises at least one diagnostic program which diagnoses said semiconductor manufacturing equipment and a control section which starts said diagnostic program when accessed by a specific user terminal given an access right, and wherein a user terminal having a right to use said diagnostic equipment, given by said specific third party for a charge, sends data which is requested by said diagnostic equipment for diagnosis and receives a result of diagnosis from said diagnostic equipment.

The present invention is further characterized in that a remote diagnostic system for semiconductor manufacturing equipment which diagnoses semiconductor manufacturing equipment connected to a piece of diagnostic equipment which is provided by a third party through a communication network, comprises a plurality of diagnostic programs which diagnose said semiconductor manufacturing equipment, a control section which starts said diagnostic program when accessed by a specific user that has been given an access right for a charge, and a guidance section which displays information about said diagnostic programs.

The present invention is further characterized in that, in a remote diagnostic system for semiconductor manufacturing equipment which diagnoses user's semiconductor manufacturing equipment connected together with a terminal to a piece of diagnostic equipment which is provided by a third party through a communication network, the diagnostic program starts when a specific user, having a right to access said diagnostic equipment for a charge, requests the user to send additional data required for the diagnosis, and diagnoses the semiconductor manufacturing equipment according to the answer from the user.

There are three types of fee-based contracts as shown below.

1) Company A (as an equipment manufacturer) sells Company B (as the user) a right to use the diagnostic equipment (including hardware and software). Company B uses the diagnostic equipment to diagnose Company B's semiconductor equipment.

2) In the above fee-based contract 1), Company B accesses the diagnostic equipment installed in Company A through a communication network.

3) In the above fee-based contract 1), Company B accesses the diagnostic equipment loaned from Company A through an intranet (MES etc.) of Company B.

The present invention can provide a remote diagnostic system and a method thereof which enables the users to carry out highly-reliable diagnoses using highly analytical data and further eases the economic burden on the developer of the diagnostic software.

BRIEF DESCRIPTION OF THE DRAWINGS

FIG. 7 is a table of lot management data which is an example of primary data used for diagnosis of the semiconductor manufacturing equipment.

FIG. 8 is a flow diagram of the processing for diagnosis of semiconductor manufacturing equipment in the periodic diagnosis mode.

DETAILED DESCRIPTION OF THE PREFERRED EMBODIMENTS

Figure 1:
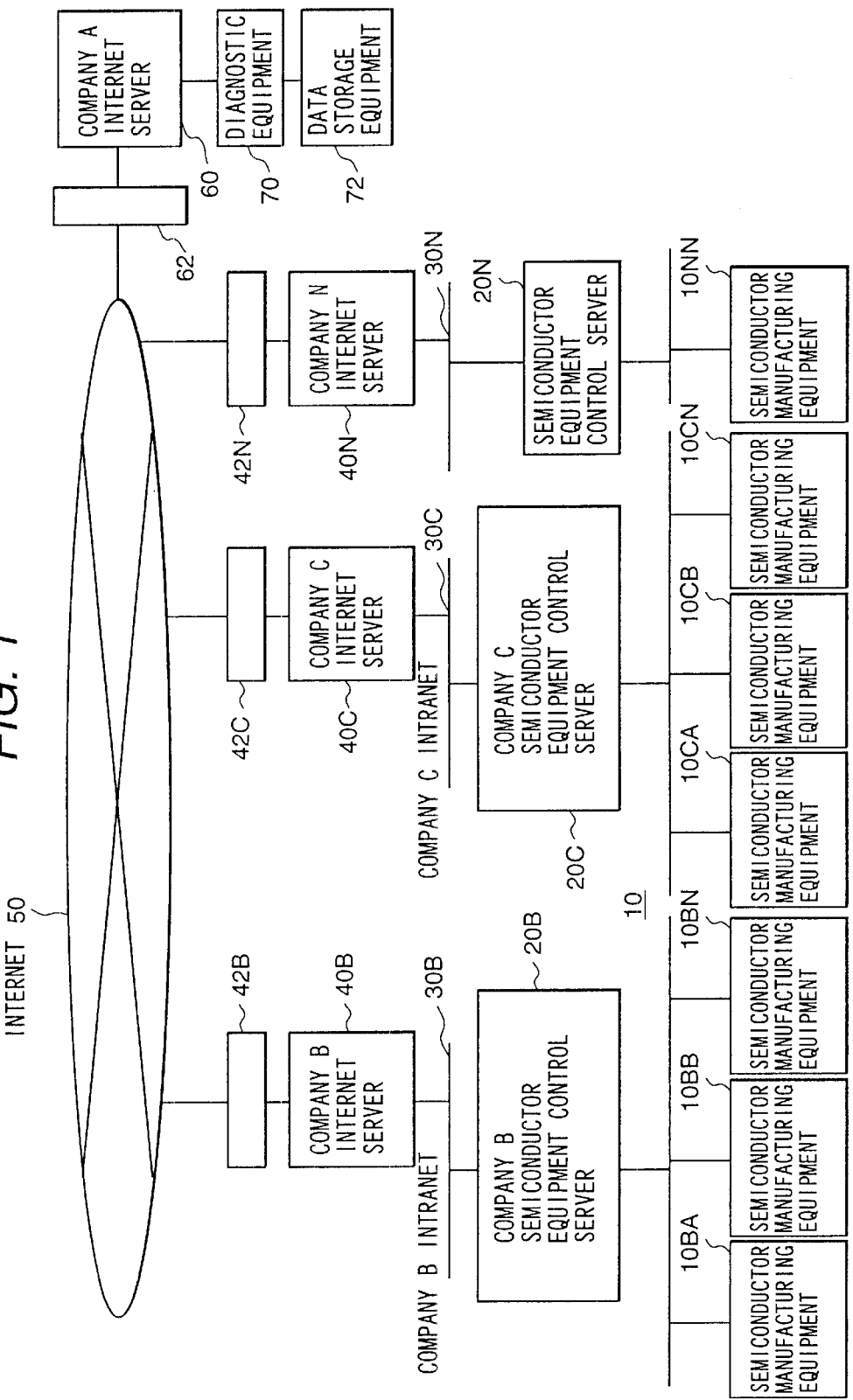
FIG. 1 is a schematic block diagram of a remote diagnostic system for diagnosis of semiconductor manufacturing equipment, which system represents a first preferred embodiment of the present invention.

An explanation of various embodiments of the present invention will be provided in order to enable a more detailed understanding of the present invention. FIG. 1 is a schematic block diagram of a remote diagnostic system for diagnosis of semiconductor manufacturing equipment, which system represents a first embodiment of the present invention. In this system, a plurality of users (Company B to Company N) access a diagnostic program (diagnostic equipment) provided by Company A, which is a third party, from the semiconductor equipment control server 20 through a communication network, for example, Internet 50, and the users diagnose their semiconductor manufacturing equipment 10 (10BA to 10BN, 10CA to 10CN, ..., 10NA to 10NN).

In this system, Company A is a manufacturer of said semiconductor manufacturing equipment 10 or a service contractor of Company A or a related company which is in charge of maintenance of the semiconductor manufacturing equipment. The users which diagnose the semiconductor manufacturing equipment can be not only a direct user of the semiconductor manufacturing equipment, but also a maintenance service company in contract with the users.

The user of the semiconductor manufacturing equipment 10 remotely diagnoses part or whole of the semiconductor manufacturing equipment 10 according to a diagnostic program provided by Company A (diagnostic equipment) when a periodic or other diagnosis is required.

In this remote diagnostic system, the semiconductor manufacturing equipment 10 (10BA to 10BN, 10CA to 10CN, ... 10NA to 10NN) of users (Company B to Company N) to be diagnosed or updated are connected to the semiconductor equipment control server 20 (20B to 20N) of respective users. The server which is a terminal used to diagnose the semiconductor manufacturing equipment is connected to intranets 30 (30B to 30N) of the users and is further connected to the Internet 50 through a respective internet server 40 (40B to 40N) and a fire-wall system 42 (42B to 42N). An intra-office network including a firewall system 62 and an Internet server 60 of Company A is also connected to the Internet 50. A piece of diagnostic equipment 70 having a diagnostic program of the semiconductor manufacturing equipment is connected to this intra-office network. Further, a piece of data storage equipment 72 containing data concerning the diagnosis of the semiconductor manufacturing equipment of each user is connected to this intra-office network.

The semiconductor manufacturing equipment, the servers, the Internet and the diagnostic equipment are connected to the network using public telephone lines, leased telephone lines, and optical communication lines. It is needless to say that each unit used for communication between users (B to N) and the manufacturer A is assigned an IP address or a specific ID number. Passwords to access specific confidential information in a diagnosis are assigned if necessary.

Servers 20 and 40 respectively comprise a computer and I/O units, such as a keyboard, a mouse, and a display unit. The server 20 has browsing software (WWW browser) to access the Internet 50 and connect to the server 60 of Company A. Further, each piece of semiconductor manufacturing equipment 10 (10BA to 10NN) has a personal computer and I/O units, such as a keyboard, a mouse, and a display unit.

Each computer of servers 20 and 40, etc. has an interface for communication with external units. The microcomputer of each computer transfers data and commands to and from external units through this interface. Further, each computer has another communication interface to modulate and send data and commands which are created by the microcomputer and to receive and demodulate data and commands from the outside through telephone lines, etc.

In FIG. 1, a terminal for diagnosis is provided in the semiconductor equipment control server 20 through which all pieces of the semiconductor manufacturing equipment 10 of each user access the diagnostic equipment 70. In this system, it is possible to omit the server 20 and place a diagnostic terminal in each piece of semiconductor manufacturing equipment 10 or in the Internet server 40 to access the diagnostic equipment from this terminal.

The diagnostic equipment 70 is used to diagnose the semiconductor manufacturing equipment 10 at the user's judgment or taking Company A's advice in the following cases:

(1) when a periodic troubleshooting is to be executed,
(2) when an abnormal status is found in the semiconductor manufacturing equipment, or
(3) when an explicit failure is found.

The result of diagnosis by the diagnostic equipment 70 by accesses from each user is stored in the data storage equipment 72 of the Company A's diagnostic equipment and is also analyzed as information representing hourly changes in the semiconductor manufacturing equipment 10. This kind of information is used for the next diagnoses of the semiconductor manufacturing equipment 10. However, user's confidential data, such as detailed layer types of semiconductor products and the like, can be deleted at the user's judgment without being stored in the data storage equipment 72.

The user determines whether to carry out a diagnosis and can access the diagnostic equipment 70 from each piece of the semiconductor manufacturing equipment 10A to 10N. In this case, the semiconductor manufacturing equipment 10 is connected to the diagnostic equipment 70 through the server 20 of the company and through the Internet 50. A program for this connection is preinstalled in the microcomputer of the semiconductor manufacturing equipment 10A to 10N.

Figure 2:
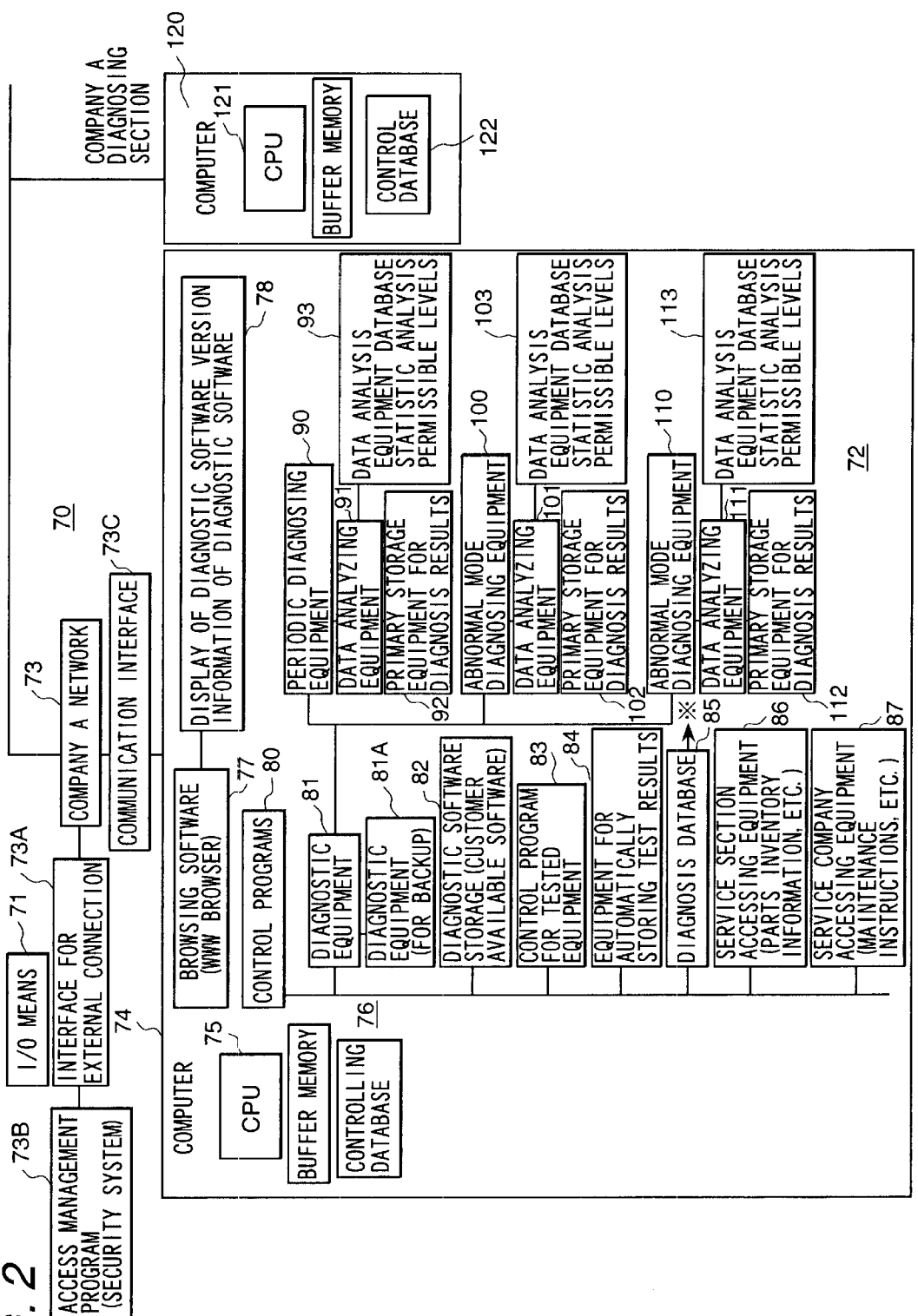
FIG. 2 is a block diagram of the diagnostic equipment of FIG. 1.

FIG. 2 shows the configuration of the diagnostic equipment 70 and the data storage equipment 72 of FIG. 1. The diagnostic equipment 70 comprises, for example, a personal computer to which I/O means 71 such as a keyboard, a mouse, and a display unit are connected.

The access management program 73B and interface 73A are provided for external connection work to interface the Company A's network 73 to the outside. A password is required to access the Company A's network 73. Further, a security system is provided for units connected to the intra-office network of Company A.

It is vague whether the items of underlined symbols in FIG. 2 are related to interface in the intra-office network of Company A or connection to the outside of Company A. However, judging from the description below, the diagnostic equipment seems to also have an interface for external connection because accessing to the outside is effected through the server of Company A.

To the network 73 of Company A there are connected an interface 73A for connection to external units, an access management program 73B, and a communication interface 73C. The present diagnostic equipment 70 is connected to the network 73.

The microcomputer 74 in the diagnostic equipment 70 contains a CPU 75 and storage means 76. Data (including normal data) concerning each piece of equipment is stored in the data storage equipment of Company A and is used for analysis of the result of diagnosis (by comparing the result data by normal data). The access management program 73B checks a password to see whether a user trying to access the diagnostic equipment 70 has a right to access. When the password is valid and the user has a right to access, the program 73B allows the user to use the preset program and data.

The microcomputer also contains browsing software (WWW browser) 77 to access Internet 50 and connect to the server 40 and a guidance section 78 which displays the latest versions of diagnostic programs and information concerning the diagnostic software. Users can browse the display and information freely.

The storage means 76 (and the data storage equipment 72) stores control programs 80 containing diagnosis programs for remote diagnosis and related databases. When an authorized user accesses the equipment, the control program 80 starts the diagnostic equipment 81 and performs diagnostic processing requested by the user. Means 81A backs up the diagnostic equipment. Means 82 stores diagnostic software which can be used by the users. Means 83 stores programs for controlling the equipment to be diagnosed or the semiconductor manufacturing equipment. Means 84 automatically stores the result of diagnosis. Means 85 is a diagnostic database. Means 86 is used to access a service section to obtain parts inventory information. Means 87 is used to access a maintenance service company to instruct maintenance.

Means 90 is a piece of periodic diagnostic equipment (program) for periodically diagnosing the semiconductor manufacturing equipment. Means 91 is its data analyzing equipment. Means 92 stores primary data of the result of diagnosis. Means 93 is a database for the data analyzing equipment.

Means 100 is an abnormal mode diagnosing unit (program) which temporarily diagnoses the semiconductor manufacturing equipment when it is abnormal. Means 101 is its data analyzing equipment. Means 102 stores primary data of the result of diagnosis. Means 103 is a database for the data analyzing equipment.

Means 110 is a diagnostic processing unit (program) which temporarily diagnoses the semiconductor manufacturing equipment when a possibly faulty part of the equipment is known to some extent. Means 111 is its data analyzing equipment. Means 112 stores primary data of the result of diagnosis. Means 113 is a database for the data analyzing equipment.

In addition to the three diagnostic programs, the diagnostic processing unit (program) can contain, for example, software for each kind of semiconductor manufacturing equipment, software for diagnosing a specific component of the semiconductor manufacturing equipment, such as a wafer handler or a vacuum chamber, software for diagnosing the whole production line, including some pieces of semiconductor manufacturing equipment or software for diagnosing process steps if necessary.

The diagnostic equipment 70 has a primary diagnostic data storage area for each contracted user. Company A cannot access this area. In more detail, only the related users can access the primary storage equipment 92, 102, and 112, but Company A is inhibited from access to the primary storage equipment 92, 102, and 112 by a contract to protect privileged information. However, the result of diagnosis pertaining to the normal/abnormal status of the equipment is automatically stored. The user can delete information items belonging to the user's security information, such as product layer types, detailed recipes, etc. without storing them in the data storage equipment of Company A. Data stored in the primary storage equipment is automatically deleted at the end of a diagnosis, when instructed by the user. The user can store the detailed result of diagnosis (when required) in a user's storage unit (not visible in the FIG. 2) before the diagnosis ends.

Company B, which is one of the semiconductor manufacturing equipment users, can diagnose its semiconductor manufacturing equipment using software and data in the diagnostic equipment 70 which is available to the user, such as the latest version of the diagnostic programs displayed on the guidance section 78, information concerning diagnostic software, diagnostic software stored in the storage unit 82 (which stores user's diagnostic software) and data in the user's primary diagnostic data storage area. Company B is not allowed to access the other areas in the diagnostic equipment 70, because such areas contain confidential data of Company A and other users. Therefore, the user can use the diagnostic software, but is not allowed to change the diagnostic software and access the component programs of the diagnostic software. Such violations are prohibited by the contract or the like.

The record of diagnoses of the semiconductor manufacturing equipment by Company B can be stored in the maintenance information database (which is the primary storage equipment of Company B only) in the diagnostic equipment 70 of Company A. This record can contain confidential data of Company B, such as production information. In other words, Company B can delete data which is assumed to be confidential by Company B from the diagnostic result information stored in Company A, but the detailed diagnostic result information can be stored as a database of Company B in the storage equipment of the diagnostic equipment 70 of Company A. Company B manages these kinds of information.

In summary, the present invention can provide a remote diagnostic system which aims to achieve both high security of information and prevention of economic losses in the remote diagnosis of facilities.

When Company A comprises a maintenance service company and a manufacturer, their data storage units store and manage identical data, so that maintenance and repair may be carried out immediately. The maintenance service company contracts to take maintenance and diagnostic jobs and further carries out procurement of parts and other required items. The equipment manufacturer receives data and instructs the service maintenance company to effect repairs according to the data.

The diagnostic programs 70 (80 to 113) of Company A are upgraded if necessary and are supplied to the user by means 78 which displays the latest versions of diagnostic programs, information of respective diagnostic software or information of diagnostic programs to be provided. With this, the user can always execute the latest diagnosis. Company A and the service maintenance company collect the latest information concerning diagnosis, inspection, and maintenance of the semiconductor manufacturing equipment from users, improves and upgrades the diagnostic programs 70 according to the result, and re-distributes the updated programs to the users.

For example, the result of diagnosis of each user using the diagnostic programs 70 of Company A is stored in the data storage unit of Company A and also is analyzed as information indicating the hourly change of equipment status. This information is passed on to the next diagnosis. For example, the life of a pressure gauge (or required calibration timing of the gauge) cannot be determined directly because it is dependent upon the operating conditions and environments. If such information is collected and analyzed by users (not a specific user) under various conditions, it is compared by diagnostic information, which makes the diagnosis more accurate.

The diagnostic program 76 is also upgraded when the semiconductor manufacturing equipment is improved or replaced.

If the diagnostic program 76 is installed in the semiconductor manufacturing equipment of each company, it is hard to completely upgrade the diagnostic programs of the companies. Therefore, the diagnostic programs are preferentially installed in Company A.

When each semiconductor manufacturing equipment is provided with a piece of diagnostic equipment in the present remote diagnostic system, the diagnostic equipment of Company A supplies version information so that respective users may install the latest diagnostic program in the semiconductor manufacturing equipment or the server of the user through the Internet.

Accordingly, the present invention can provide an environment which can present diagnostic programs of higher function and higher quality to the user even after the facilities are installed.

To the diagnostic equipment 70 there is connected a computer 120 of the diagnosing section of Company A through the network of Company A. This computer 120 comprises a CPU 121, a buffer memory, a control database 122, input means and output means including a display section. During diagnosis by the diagnostic equipment, the operator uses this section to process inquiries from users, make responses, and instruct or communicate with the service section or maintenance service company according to the result of the diagnosis.

The diagnosing section uses the result of diagnosis of each user stored in the data storage equipment (except non-confidential user information) to analyze the status of the equipment, such as hourly changes of pressure gauges.

The programs and databases are updated so that the information may be passed on to the next diagnosis. By analyzing lots of information collected by a plurality of users under various conditions, it is possible to provide updated diagnostic programs of higher accuracy in a short time period.

Figure 3:
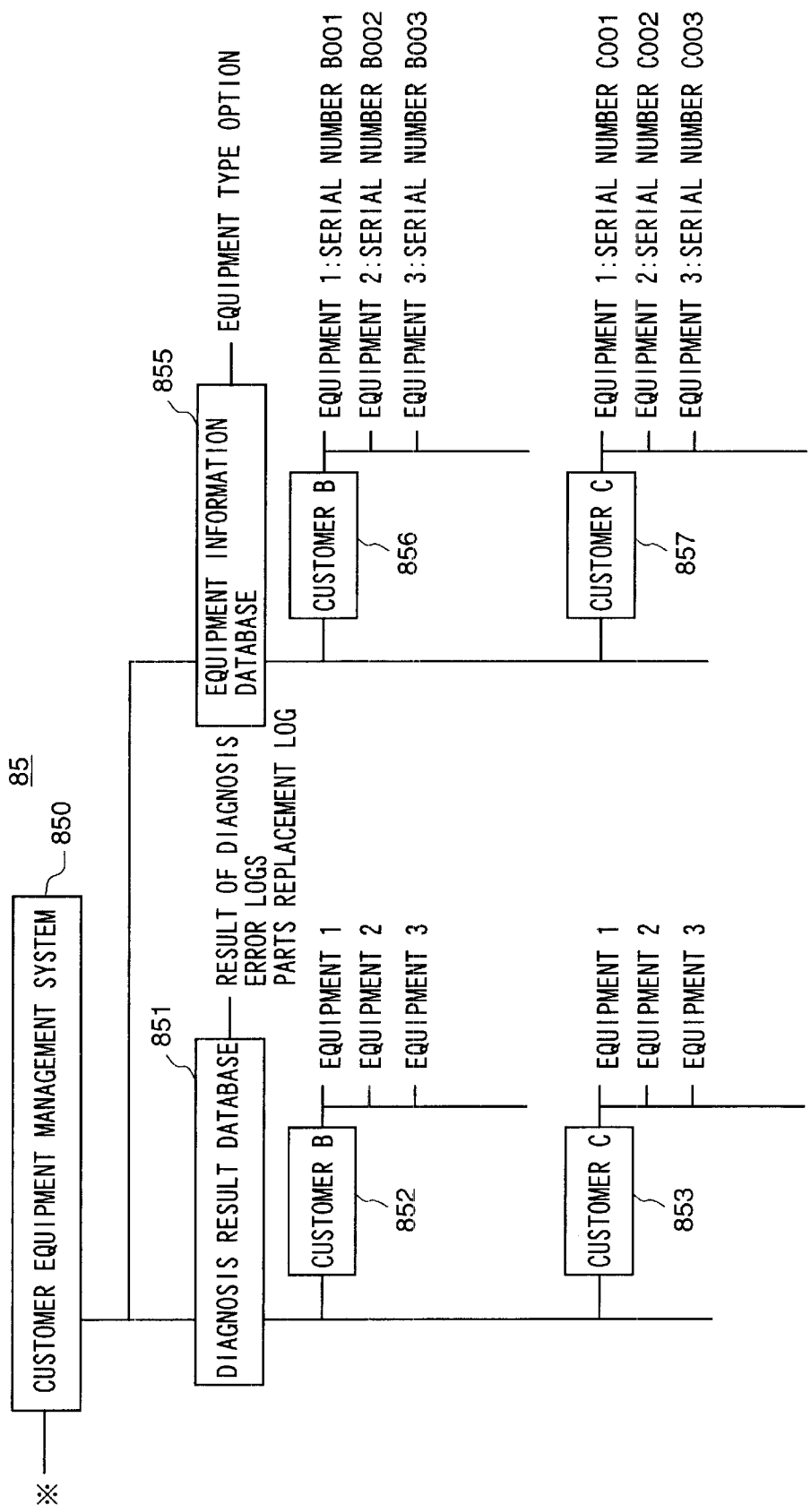
FIG. 3 is a diagram showing the detailed configuration of the diagnostic database of FIG. 2.

This diagnosing section of Company A assumes that the diagnostic operations, such as data acquisition and analysis, are fully automated. However, the related professionals can join the diagnostic operations when requested by the user. This is very effective in diagnosis of errors and troubleshooting. In this case, the professionals access the diagnostic equipment through the network of Company A for faster and more accurate diagnosis and judgment. Generally, the conventional diagnostic equipment is designed while assuming fully-automated and unmanned operations. However, with the intervention of professionals, the diagnosing performance is improved further. FIG. 3 shows a detailed configuration of the diagnostic database. Means 850, 851, and 855 are respectively a customer equipment management system, a diagnosis result database, and an equipment information database in that order. The diagnosis result database 851 stores the results of diagnoses, histories of errors, and histories of parts replacement of each user (B, C, . . . , N) in the arrangement. The equipment information database 855 stores models of semiconductor manufacturing equipment, product specifications, results of performance inspections, information of components used, etc. of each user (B, C, . . . , N) in the arrangement.

Figure 4:
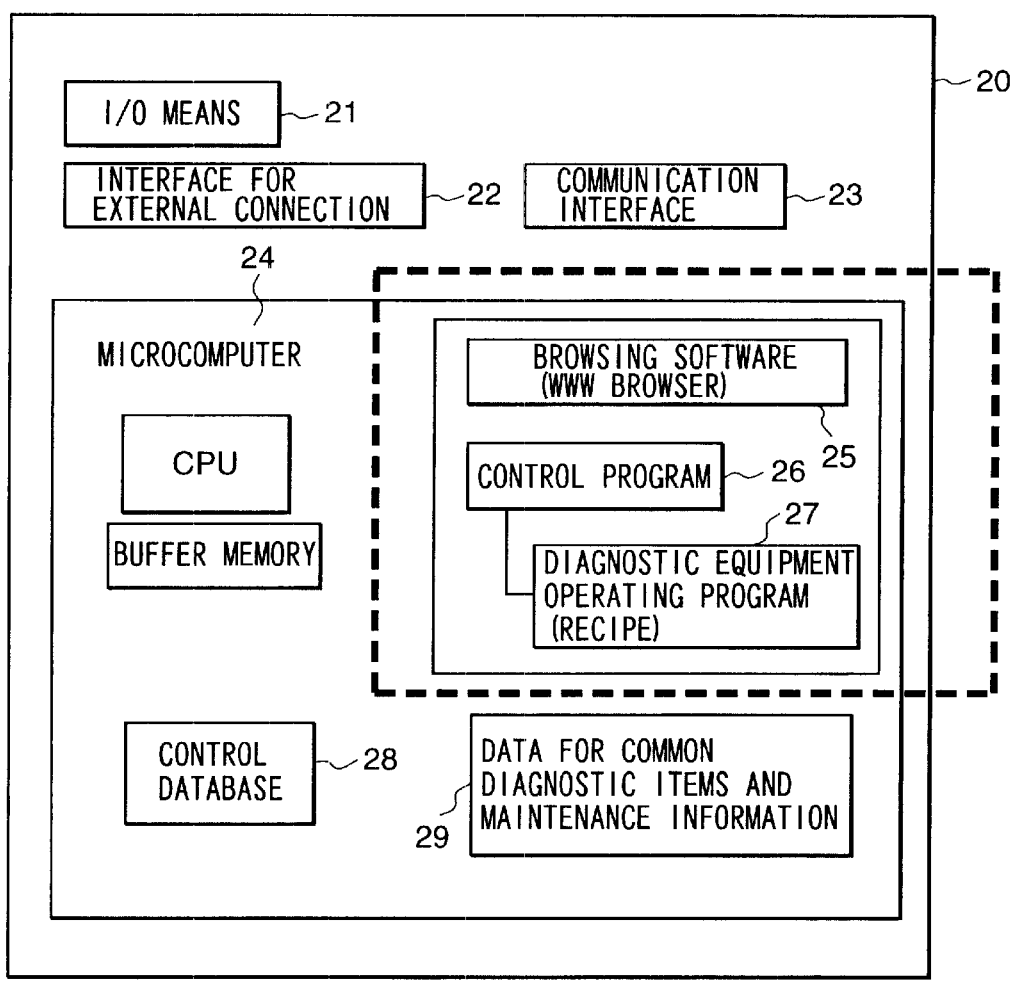
FIG. 4 is a diagram showing of the configuration of a semiconductor manufacturing equipment control server in the remote diagnostic system of FIG. 1.

FIG. 4 shows a configuration of a semiconductor manufacturing equipment control server 20 equipped with a diagnostic terminal. The description below uses the server 20B of Company B as an example. The semiconductor manufacturing equipment control server 20 comprises a microcomputer having a CPU and a buffer memory to which I/O means 21, such as a keyboard, a mouse, and a display unit, are connected. Further, the server 20 is equipped with interface 22 for external connection and communication interface 23. The memory means in the microcomputer 24 stores browsing software (WWW browser) 25 which accesses the Internet 50 via the server 40 to link to the server 60. Passwords to access the diagnostic equipment 70 must be set in advance in the contract between companies A and B. Further, the memory means stores control programs 26 for controlling the semiconductor manufacturing equipment 10 (10A to 10N) to manufacture semiconductor products, and control programs or recipes required to carry out diagnoses upon instructions from Company A. These programs can be downloaded from the server of Company A when required without being pre-installed in the server 20. The control programs 26 contain diagnostic equipment operating programs (recipes) 27.

The semiconductor manufacturing equipment control server 20 also stores a control database containing various kinds of information, a database 29 containing common diagnostic items, results of diagnoses, and maintenance information, a database containing security-related information, and other databases. Log data recording equipment operations required for diagnosis is stored in a database 29 which stores common diagnostic items and maintenance information.

As explained above, the diagnostic functions of the terminal can be installed in respective semiconductor manufacturing equipment or a host server instead of the server 20.

Figure 5:
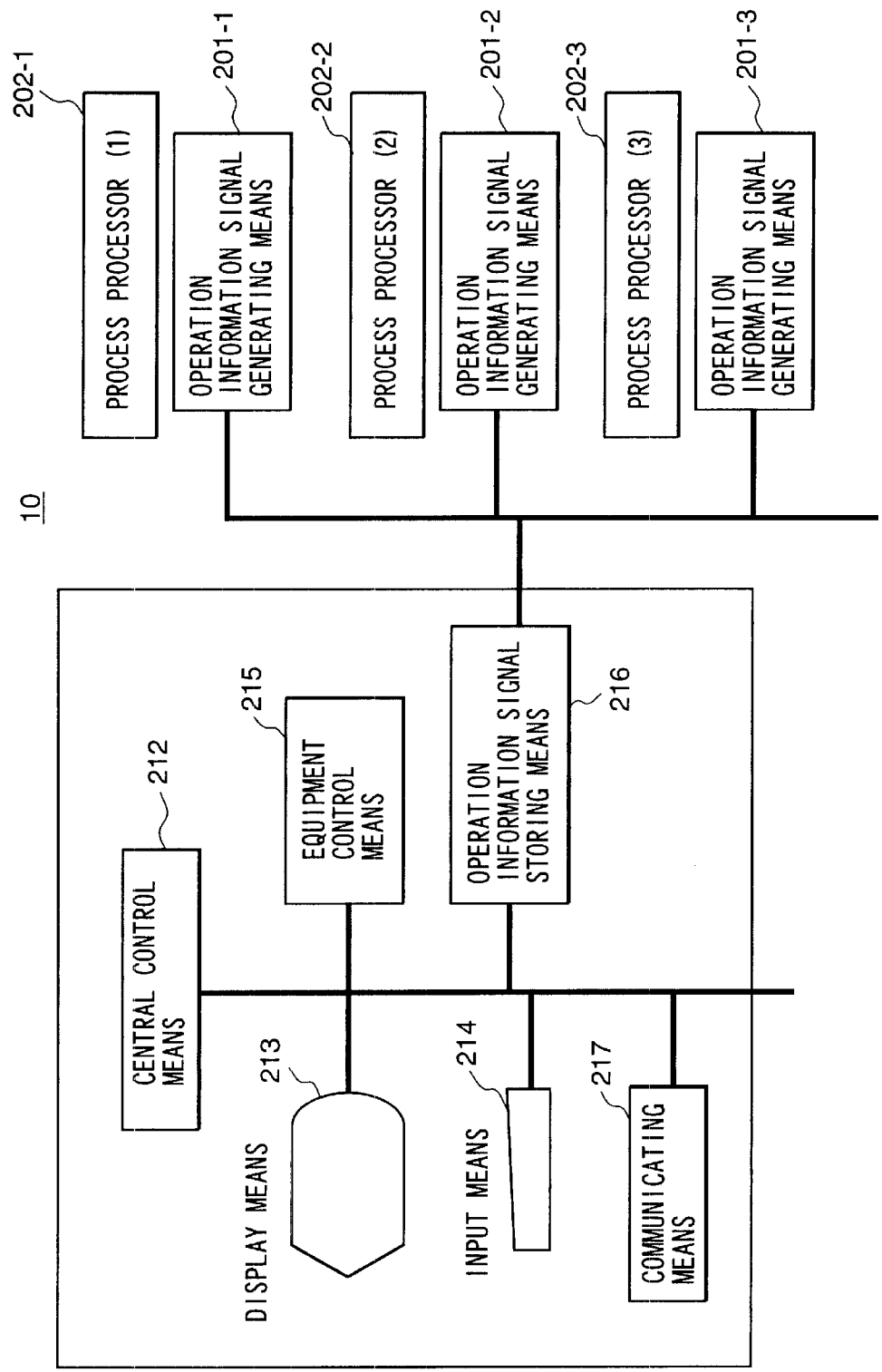
FIG. 5 is a block diagram of the semiconductor manufacturing equipment being controlled in the remote diagnostic system of FIG. 1.

FIG. 5 shows an embodiment of the semiconductor manufacturing equipment 10 (10A to 10N) to be diagnosed. This embodiment has four pieces of semiconductor manufacturing equipment to be diagnosed (but only three pieces of semiconductor manufacturing equipment are visible in FIG. 5). A central control means 212 controls the whole semiconductor manufacturing equipment (or manufacturing line). In other words, the central control means 212 is a CPU. Means 213 displays the operating status, the content of the setting of operating conditions, and indications to start or end the operation. For example, means 213 is a CRT display unit. Means 214 is used to set operating conditions, enter operation start commands, processing conditions, and execute maintenance operations. Means 214 is, for example, a keyboard. Means 202-1 to 202-4 are wafer processors, such as equipment for etching, post-processing, layer formation, sputtering, CVD, water-processing or any other wafer processing.

Equipment control means 215 stores a processing procedure comprising the steps of checking the status (Enabled or Disabled) of the wafer processors 202-1 to 202-4 while an automatic operation is in progress, stopping a wafer processor if it is disabled, and continuing the automatic operation using the other available wafer processor. Means 215 is, for example, a ROM. Process sequence information storing means 216 stores a sequence of the processing of wafers in a process chamber. Means 216 is, for example, a RAM. This sequence is determined by the operator using the display means 213 and the input means 214. Operation information signal storing means 217 stores operation information signals indicating whether the wafer processors 202-1 to 202-4 are enabled or disabled. Means 217 is, for example, a RAM.

Operation information signal generating means 201-1 to 201-4 respectively generate operation information signals indicating whether the wafer processors 202-1 to 202-4 are enabled or disabled. In this embodiment, the operation information signal generating means is provided in each wafer processor, but the means 201-1 to 201-4 can be placed anywhere. The means 201-1 to 201-4 operate to generate an operation information signal in the following way:

1) Wafer processor power-off signal
2) Signal for switching between Enabled and Disabled states of a wafer processor (e.g., a selection switch)
3) Input signal which the operator set and entered as an operation control signal (Enabled and Disabled states of a wafer processor).

Figure 6:
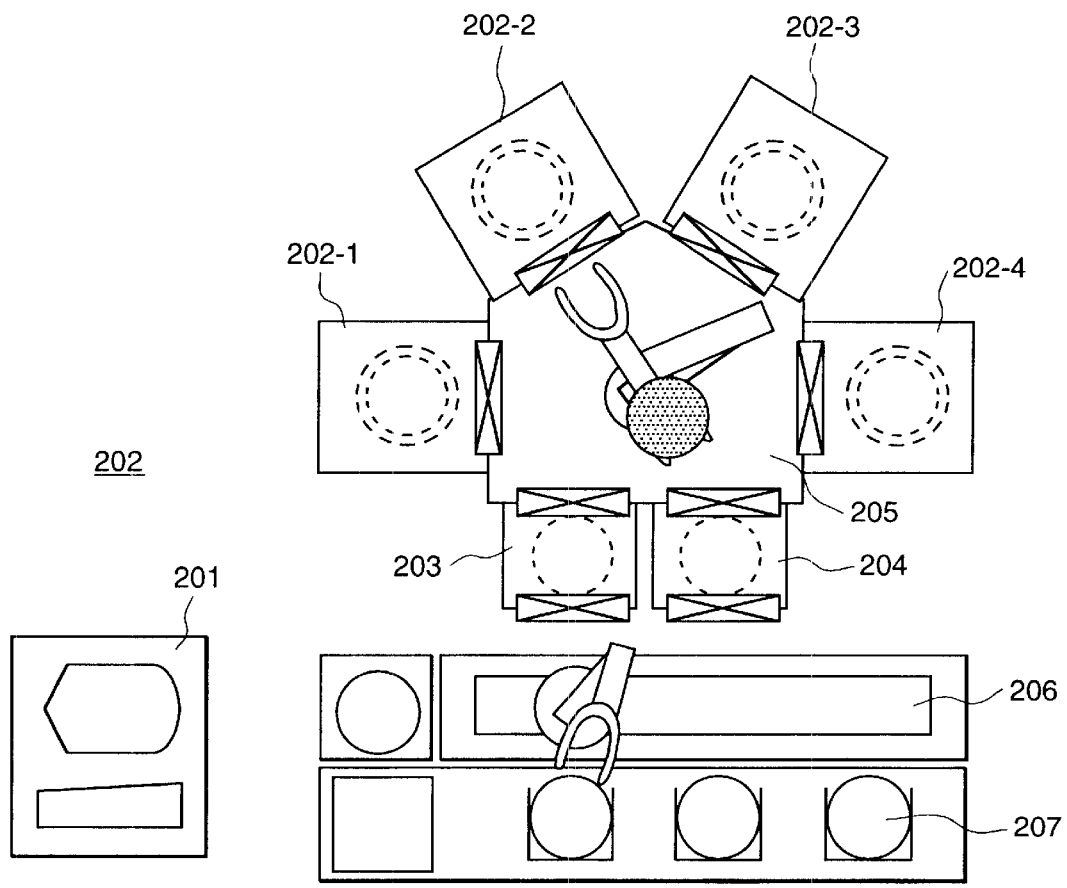
FIG. 6 is a diagram of a vacuum processor which is used as one of the wafer processors of FIG. 5.

FIG. 6 shows a vacuum processor which is used as one of the wafer processors 202-1 to 202-4 of FIG. 5. In FIG. 6, a wafer handler 201 transfers a wafer from a load lock chamber 203 to a preset wafer processor 202-1 to 202-4 according to a wafer transfer schedule. When processing of the wafer in the wafer processor is completed, the wafer handler 201 transfers the processed wafer to the next selected processor. When all processes of the wafer are completed, the wafer handler transfers the completed wafer to the unload lock chamber 204. The load lock chamber receives a wafer from the atmospheric conveyer means 206 and sends it into the wafer handler 201. The unload lock chamber 204 receives a processed wafer from the wafer handler and places it on the atmospheric conveyer means 206. A vacuum robot 205 in the wafer handler transfers a wafer in the wafer handler. The atmospheric conveyor means 206 conveys wafer cassettes on it. The wafer cassette 207 contains wafers to be processed or cleaning wafers. The atmospheric conveyer means 206 takes out a wafer from the wafer cassette, transfers it to the load lock chamber 203, takes a processed wafer from the unload lock chamber, and places the wafer in the original wafer cassette.

The vacuum processor of FIG. 6 can be replaced by other processing equipment not having the atmospheric conveyor means and the atmospheric robot.

FIG. 7 shows the outline of lot management data which is an example of primary data used for diagnosis of the semiconductor manufacturing equipment. The lot record is a log of process states of the semiconductor manufacturing equipment of Company B. Usually, the lot record contains the monitored quantities of recipe items, for example, "Flow rate 101 ml/min monitored at a gas flow rate of 100 ml/min)." A "recipe" is a record of process conditions of a product.

FIG. 7 shows historical data (lot record) of Lot No. 123, Cassette No. 2, and Date of Start Sep. 9, 2000 10:15:36. This record contains a lot name, a process name, an operator name, a recipe number, a process recipe, the number of wafers supplied, etc. It also contains data concerning wafers processed by the etching chamber 1, such as wafer numbers, step numbers, gas flow rates, plasma source power, processing pressures, openings of pressure regulating valves, etc. FIG. 7 lists data of wafers of lot No. 123 in cassette No. 2. Lot records of other lots and other cassettes are also collected and stored. The items in FIG. 7 are listed simply as an example and can be freely changed if necessary.

FIG. 8 and later figures show how the user of the semiconductor manufacturing equipment uses the diagnostic equipment of the manufacturer of the semiconductor manufacturing equipment to diagnose the equipment. There are three diagnostic modes: a periodic diagnosis mode, an abnormality diagnosis mode (non-periodic diagnosis mode which is executed at the occurrence of a failure), and a troubleshooting mode.

First, the periodic diagnosis mode will be explained with reference to FIG. 8. This periodic diagnosis mode periodically diagnoses the semiconductor manufacturing equipment using the periodic diagnosis processor 90 provided in the diagnostic equipment 70.

At the start of periodic diagnosis, the periodic diagnosis mode program starts when the user (B to N) accesses the server of the equipment manufacturer A to request the diagnostic equipment (900 to 904). The user cannot directly access the programs of the diagnostic system. When the periodic diagnosis mode starts, the diagnostic equipment requests the user to send primary data (906). The user sends the requested data to the equipment manufacturer via the server and the Internet (908 and 910). The diagnostic equipment 70 receives and stores the data in the periodic diagnosis database 93. This returned data contains production log data of FIG. 7.

The periodic diagnosis processor 90 executes periodic diagnosis and analysis according to the requested data. This operation contains a comparison of the obtained data by reference values (normal values) which are based on old data (912 and 914). For example, the user can get a transition of pressure values Pa of the vacuum processing chamber by comparing the obtained process pressure values Pa by reference to pressure values (normal value) which are based on old data.

Figure 9:
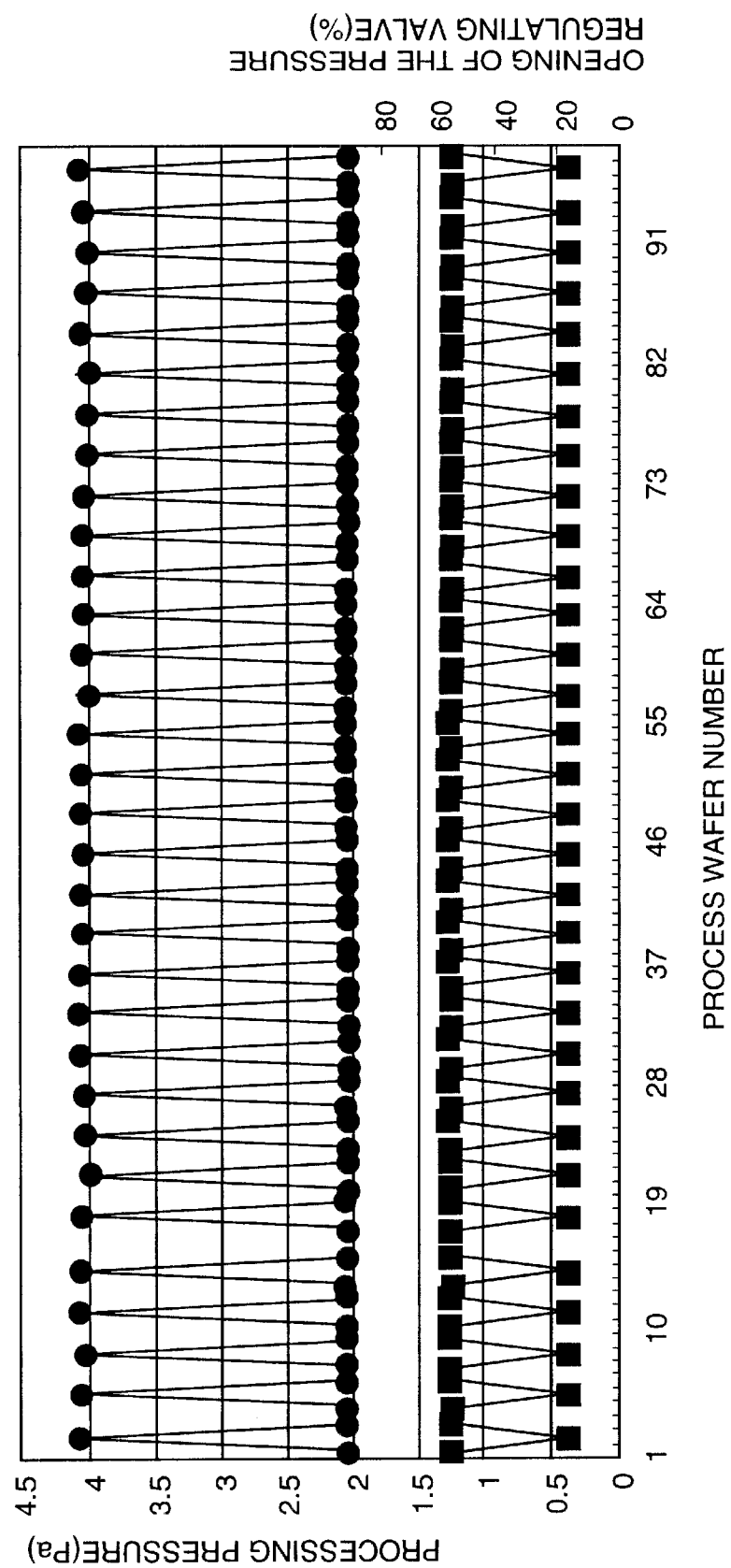
FIG. 9 is a graph representing the relationship between process pressures Pa and openings of the pressure regulating valve of FIG. 7.

FIG. 9 is a graph representing the relationship between process pressures Pa and openings of the pressure regulating valve of a lot of wafers which are arranged from the lot record. When the rate of data fluctuation is within a predetermined range relative to the reference value, for example ±5%, the equipment is assumed to be normal.

The data of FIG. 9 is analyzed as information concerning hourly change of the semiconductor manufacturing equipment. This information is passed on to the succeeding diagnosis. For example, we cannot directly determine the life of a pressure gauge (or required calibration timing of the gauge) because it is dependent upon the operating conditions and environments. When these kinds of information are analyzed as a result of the operations of users (not a specific user) under various conditions and are compared by diagnostic information, diagnoses of higher accuracy can be expected.

Figure 10:
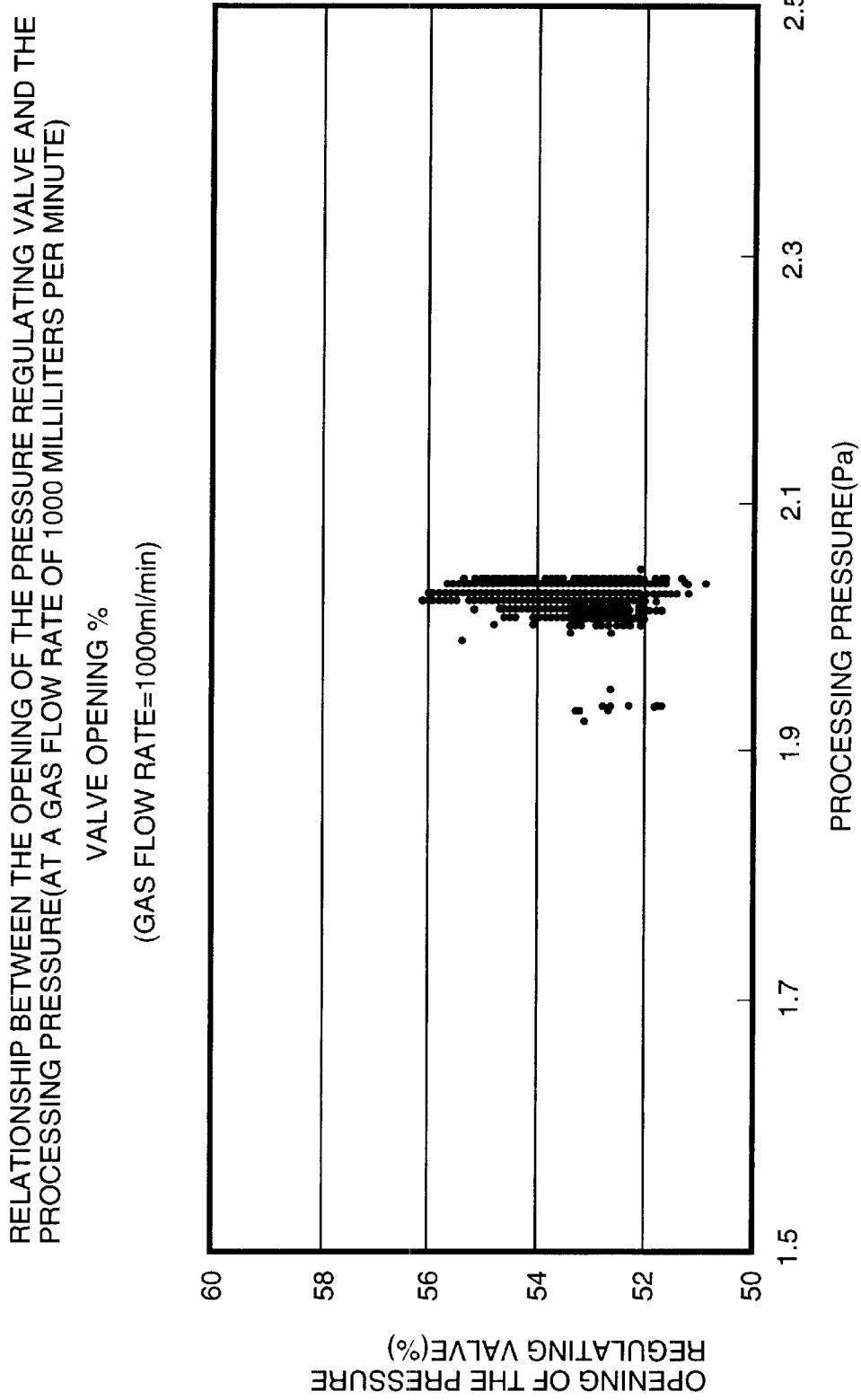
FIG. 10 is a graph which shows a relationship between the opening of a pressure regulating valve and a process pressure Pa in the normal status.

FIG. 10 shows a relationship between the opening of a pressure regulating valve and a process pressure Pa in the normal status. A great many process pressure values are at 2 Pa or in the vicinity thereof, and the openings of the pressure regulating valve are in the range of 51% to 56%. However, another set of data is also found in an area of 52% to 53% (as the valve opening) and 1.95 Pa (as the process pressure). As the process pressure value 1.95 Pa is in the range of 1.9 Pa to 2.1 Pa (5% relative to the set value 2 Pa), these values are assumed to be valid. However, we may have vague misgivings about the possibility that these sets of data values may be caused by a certain problem.

The data shown in FIG. 10 is not sufficient to judge correctly even when the cause of data exceeding the analytic data is estimated. For example, if a layer of deposit gradually grows on the inner walls of the equipment, the number of gas molecules from the deposit layer increases as the deposit layer becomes thicker. This increases the flow rate of the etching gas. In other words, the pressure to be controlled contains a gas from the deposit layer besides the etching gas. Therefore, the pressure of the gas dissociated and decomposed by plasma is different from the pressure obtained by decomposing and dissociating the pure etching gas. Therefore, it is possible that, even when the constantpressure function is normal, the pressure reading remains still and the opening of the pressure regulating valve is changed. The pressure change at the same valve opening may also be caused by a change of the measured pressure, a change of the temperature of the gas to be measured, a pressure gauge failure, a change of the temperature in the pressure gauge site, electromagnetic noises from the plasma, or a failure of the pressure regulating valve.

Further, there still is another possible cause. The pressure regulating valve controls the effective evacuation speed of the vacuum pump by adjusting the opening of the valve and varying the conductance of gas molecules. However, the conductance of the gas molecules is dependent upon the weight and temperature of the gas molecules. Therefore, the gas molecule conductance varies as the plasma composition varies. This may also cause a pressure change at the same valve opening. Therefore, a simple pressure change investigation is not enough to obtain true causes of the change in the pressure or valve opening and to determine adequate actions to undertake for repair.

For accurate judgment of the causes, plasma characteristic changes, relationships with other data, comparison by old data, and close analyses are required. For this analysis, comparison by pre-analyzed data and use of various statistical analyzing means are effective. Further, it is also effective to obtain experimental relationships of flow rates, pressures, and valve openings of an inert gas, such as argon, without generation of plasma, or to collect temperature data of pressure gauges and inner walls of the process chamber, and thus to check the operating status of each apparatus by these data and relationship data.

In this case, it is required to run the semiconductor manufacturing equipment particularly to collect data. This process is equivalent to processes from "Request additional data" (926) to "Get diagnostic and operation data" (934) in FIG. 8.

The just-etching time in FIG. 7 is an etching time measured by means to judge the end of etching (which is installed in each of the wafer processors 202-1 to 202-4 but not visible in FIG. 6). If this etching time gradually changes in relation to the process time (plasma discharging time) after the equipment is opened to the atmosphere and cleaned, it is possible to check the time to clean the equipment by periodically monitoring the fluctuation of the etching time. It is also possible to monitor the plasma cleaning time and initialize the inside of the equipment by plasma cleaning at the time. Since this plasma cleaning is periodically carried out according to the result of diagnosis, the out-of-service time of the equipment can be minimized. As a result, the net working rate of the equipment increases and the operation becomes stable.

If the just-etching time varies abruptly, it is assumed that the equipment has a problem. In such case, an abnormality diagnosis mode (to be explained later) must be carried out. When analysis of a relationship of etching time fluctuations, inner wall temperatures, and other parameters explicitly clarifies the relationship of various parameters, such parameters can be actively controlled so as to provide an equipment control system having a constant etching time fluctuation. Although this system cannot be a diagnostic system, the performance of the equipment can be stabilized by applying and developing the diagnostic system of the present invention.

As for plasma, it is possible to check whether the source power, reflection data, and tuning are right (in FIG. 7) by the positional change of the stub tuners (STB1, STB2, and STB3) and the change of the wafer bias voltages Vpp. When the equipment has a dedicated plasma monitor or the like, more accurate fluctuations can be obtained.

The result of diagnosis is sent as a result of periodic diagnosis to the user (916 and 918) and stored together with diagnosis and analysis data in the storage equipment of the user (920). The result of diagnosis is also stored as user equipment management data in the storage unit 85 of the equipment manufacturer A (922). The result of diagnosis is reported to the service section (or the maintenance service company A2) if necessary (924).

The user can delete the diagnostic data (user's production information used for analysis) or protect it against read-accessing. The manufacturer of the semiconductor manufacturing equipment is not prohibited from accessing the user's equipment control data to read the data without permission from the user. The manufacturer cannot delete the user's equipment control data. The user's equipment control data remains as service information for Company B to Company N in the data storage equipment of Company A. This data can be used to check the life of each part (maintenance time), inventory management, and so on. Lot names (except symbolic lot names which are meaningless for third parties), process names, number of wafers processed (belonging to production information of products) are user's confidential data. Layer types, layer thickness, product names, etc. are also confidential data of users (although they are not visible in FIG. 7). The user's unique etching recipes (detailed data such as name of gas, flow rate, pressure, time, etc. of FIG. 7) are also confidential data of users. Further, data about the result of etching which is collectively managed belongs to the confidential data of users, although the data is not equipment monitor data. For example, such kinds of data indicate the relationship of qualities of semiconductor products, including semiconductor manufacturing processes, etching patterns, data about electric characteristics of semiconductor products, status of failures (yield), and so on. These kinds of data are extremely important data with respect to whether the equipment is normal and whether the data fluctuation is in a preset tolerance and are used to finally determine whether the products are acceptable or not acceptable.

Accordingly, such kinds of data directly relate to production information and must be handled as confidential. When the user makes such kinds of data confidential, the user discloses only tolerances of data obtained from the equipment to the manufacturer A of the semiconductor manufacturing equipment. In this case, the user need not disclose the reasons and grounds of the tolerances (such as yields). Data stored in the equipment manufacturer A is as shown in FIG. 9 and FIG. 10 plotted from the lot data (see FIG. 7).

These kinds of data are stored and managed with the name of user's equipment (serial number) and a date or an appropriate name. If layer kinds and etching recipes are required for data management, they can be managed by proper symbolic names instead of concrete names.

If the data for diagnosis and analysis is not enough, the diagnostic equipment requests the user to send additional data (926). If the equipment must be run to get data for diagnosis, the equipment manufacturer asks the user to temporarily run the equipment for diagnosis (928 to 930). The user has only to answer some prepared questions (such as questions on safety notices and operating notices).

A recipe to run the equipment for acquisition of diagnostic data is displayed on the user's display unit. The user starts the semiconductor manufacturing equipment to be diagnosed (930). If the user cannot start the equipment, the user gives the reason for it (932), records it in the user equipment management database 851 (922) and calls the service section (or the maintenance service company A2) when required (924). That is to say, if the user cannot run the equipment, the user indicates why the equipment cannot be run, for example, by selecting a reason in a reason list and applying a check mark to it. Judging from the result of diagnosis, Company A distributes the parts required for repair. In some cases, the problem may be dissolved by mere replacement of faulty parts. In case the equipment requires repair or replacement parts, Company A calls the service engineer of Company B and makes the necessary arrangements.

When the user runs the semiconductor manufacturing equipment according to the recipe and obtains the result of diagnosis (data), the user sends the data as additional data to the diagnostic equipment of Company A (934). Since this embodiment started the periodic diagnosis mode, the data is stored in the periodic diagnosis database 851 in the diagnostic equipment. The diagnostic equipment analyzes the additional data (936 and 938). This analysis contains comparison of the additional data by old data (normal values). The result of diagnosis (940) is sent as a result of periodic diagnosis to the user and is displayed there (942) and stored in the storage equipment of the user together with the diagnosis and analysis data (944). The result of diagnosis is also stored as customer equipment management data in the storage equipment of the equipment manufacturer A. The result is reported to the service section (or maintenance service company A2) when required.

Next, the diagnostic equipment asks the user whether or not to terminate the diagnosis (946).

The user determines "Incomplete diagnosis" (indicating that the result of the periodic diagnosis is not enough), "Deleting the analytic data and terminating the diagnosis" (indicating that the result of the periodic diagnosis is enough for diagnosis of a problem), or "Terminating the diagnosis without deleting the analytic data" (indicating that the diagnostic data is not confidential) (948). For termination of the diagnosis after deletion of the analytic data, the diagnostic equipment deletes the analytic data, the manufacturer terminates the periodic diagnosis with the user's consent (after confirming that the analytic data is deleted) (950 to 956).

Connection to the diagnostic equipment is basically free of charge. Even though the connection to the diagnostic equipment for periodic diagnosis or troubleshooting is sometimes charged, its details are signed on agreement, including personal services, procurement of parts for repairing, charging, etc.

Since the periodic diagnosis includes analysis by comparison of the current diagnostic data by old data, it can tell the user not only the equipment status (Disabled or Enabled), but also indicate judgment of non-fatal problems of the equipment, which do not affect the operation of the equipment, but are on the boundaries of the tolerances and preferably require any repair. This enables estimation of possible failures in facilities in advance, making it possible to take steps before they actually occur. This is effective to prevent economic losses.

Although the diagnostic equipment is connected to the server of Company A, it can be installed in the control server of Company B to collectively monitor all semiconductor manufacturing equipment in Company B, or it can be installed in each piece of semiconductor manufacturing equipment of Company B. In this case, programs are classified according to diagnostic functions and assigned to the semiconductor manufacturing equipment.

To use the latest version of diagnostic programs (newer than those installed in advance), the user must access the server of Company A to download the latest programs. It is preferable that the existing data for data analysis contains data of the other pieces of semiconductor manufacturing equipment. However, if each piece of semiconductor manufacturing equipment of Company B has the diagnostic equipment, it is hard to use such overall data containing data sent from the other pieces of semiconductor manufacturing equipment. Further, the diagnostic equipment is preferably installed in Company A for close and efficient contact with the professionals of Company A. More particularly, the system should preferably be so constructed that all data are sent to Company A for efficient and centralized diagnosis of all pieces of semiconductor manufacturing equipment.

As is apparent from the above description, the remote diagnosing system in accordance with the present invention features the following:

(1) The users (Company B to Company N) can freely access the remote diagnosing system.

(2) Passwords for connection to the remote diagnosing system are determined on contract.

(3) The users are not allowed to access programs of the diagnostic system, but are allowed to delete diagnostic data (user's production data etc. used for analysis) or protect them against access to read data (so that the diagnostic data may not be read without permission from the user).

(4) The results of diagnoses remain as service information (for Company B to Company N) in the data storage equipment of Company A and cannot be deleted from the data storage equipment. This data can be used for determination of the service lives of parts and inventory management, etc.

(5) The diagnosis is carried out semi-automatically. The diagnostic equipment asks the user terminal to send required data and the user answers it.

(6) The data to be returned from the user terminal contains log data.

(7) If the equipment must be run to get data for diagnosis, the equipment manufacturer asks the user to temporarily run the equipment for diagnosis. The user has only to answer some prepared questions (such as questions on safety notices and operating notices).

(8) If the user cannot start the equipment, the user gives the reason (by selecting a reason in a given reason list and applying a check mark to it).

(9) The user can call the maintenance service engineers of Company A or parts supplier according to the result of diagnosis (or even before receiving the result of diagnosis) using a Call request, Repair request, Periodic Maintenance request, Emergency call, etc.

(10) The user can arrange replacement parts according to the result of diagnosis. (Simple replacement of expendables: Parts to be repaired or replaced are arranged with Company B's consent.)

(11) Connection to the diagnostic equipment is free of charge. The connection to the diagnostic equipment for periodic diagnosis or troubleshooting is sometimes subject to a charge.

(12) The diagnostic equipment is connected to the server of Company A, pre-installed in the control server of Company B to collectively control all pieces of semiconductor manufacturing equipment of Company B, or pre-installed in each piece of semiconductor manufacturing equipment (classified and assigned according to the diagnostic functions).

Figure 11:
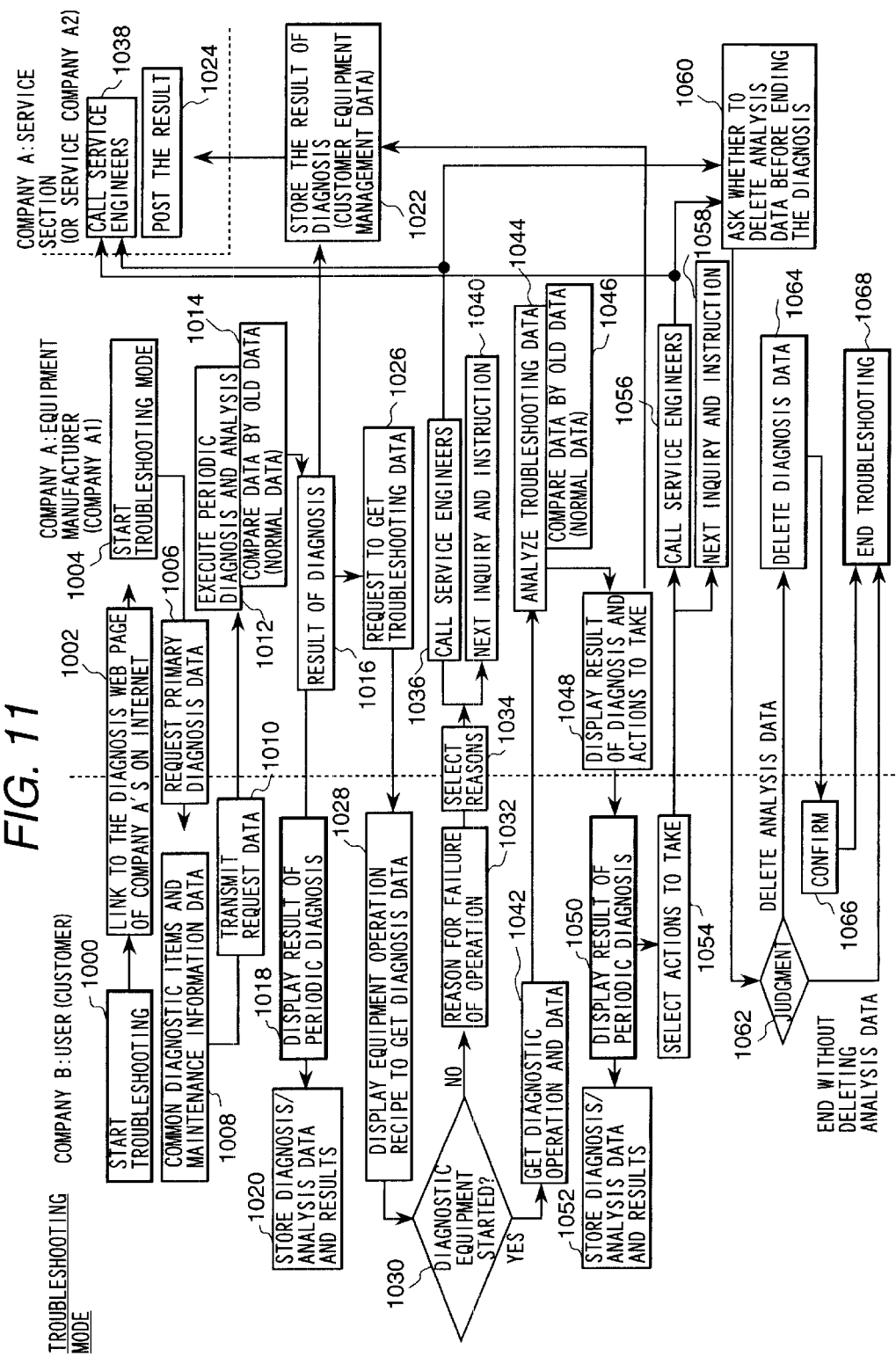
FIG. 11 is a flow diagram of the processing for diagnosis of semiconductor manufacturing equipment in the abnormality diagnosis mode.

Next, referring to FIG. 11, the abnormality diagnosis mode to be executed by the abnormality mode diagnosing equipment 100 will be explained. When a piece of semiconductor manufacturing equipment of a user (Company B to Company N) fails, the user accesses the server of the equipment manufacturer (Company A) for request of a diagnosis by the diagnostic equipment. This starts the abnormality mode program (1000 to 1004). Then, the diagnostic equipment requests the user to send the primary diagnostic data (1006). The primary diagnostic data also contains information pertaining to a log of equipment errors. The user transfers the requested data to the manufacturer A through servers and the Internet (1008 to 1010). The diagnostic equipment receives and stores the data in the periodic diagnosis database. The diagnostic equipment executes the periodic diagnosis and analysis according to the data sent from the user (1012 to 1014). The result of diagnosis is sent as a result of a periodic diagnosis to the user and is stored in the user's storage equipment together with the diagnosis and analysis data (1020).

The result of diagnosis is also stored as user equipment management data in the storage unit 85 of the equipment manufacturer A (1022). The result of diagnosis is reported to the service section (or the maintenance service company A2) if necessary (1024). Since this diagnosis is carried out because a problem is found in the semiconductor manufacturing equipment, the problem may not be detected by a normal periodic diagnosis.

If the data for diagnosis and analysis is not enough, the diagnostic equipment requests the user to send additional data (1026), shows a recipe to get the diagnostic data (1028), and asks whether the user can start the semiconductor manufacturing equipment (1030).

If the user cannot start the semiconductor manufacturing equipment, the user gives the reason (1032 and 1034) and calls the service engineer (1036) and the service section (or the maintenance service company A2) if necessary (1028). The diagnostic equipment makes another inquiry and indication (1040). For example, if the water-cooled vacuum pump of the semiconductor manufacturing equipment is disabled, the diagnostic equipment makes some inquiries such as "Cooling water flows?" "Sufficient water flow?" "In good water temperature range?" "Interlocked?" The user answers these questions. The diagnostic equipment makes an analysis, judgment, and indication according to this answer.

The user runs the semiconductor manufacturing equipment according to a given recipe, obtains the result of diagnosis (1042), and sends it as additional data to the diagnostic equipment (1044). The diagnostic equipment stores the additional data in the periodic diagnosis database of the diagnostic equipment and carries out an analysis according to the diagnostic data (1046) (including comparison of the data by old data (normal values)). The result of the diagnosis (1048) and information about repairing are sent to the user and displayed on the user's display unit (1050). The diagnosis and analysis data and the result are stored in the user's storage equipment (1052). Further, the result of diagnosis is stored as the customer equipment management data in the storage equipment of the manufacturer A and is reported to the service section (or maintenance service company A2) if necessary (1022 and 1024).

The user reads and selects repairing items from the result of the diagnosis (1054), calls the service engineer (1056 and 1038) if necessary, and makes further inquiries and indications (1058). All these communications are carried out through the Internet. If the user wants to call a service engineer, the user can call the service engineer directly by phone or indirectly through the Internet. Finally, the diagnostic equipment asks the user whether to delete the analysis data before terminating the diagnosis (1060). The user determines "Incomplete diagnosis," "Deleting the analytic data and terminating the diagnosis," or "Terminating the diagnosis without deleting the analytic data" (1062). For termination of the diagnosis after deletion of the analytic data, the diagnostic equipment deletes the analytic data. The manufacturer terminates the periodic diagnosis with the user's consent (after confirming that the analytic data is deleted) (1064 to 1068).

Figure 12:
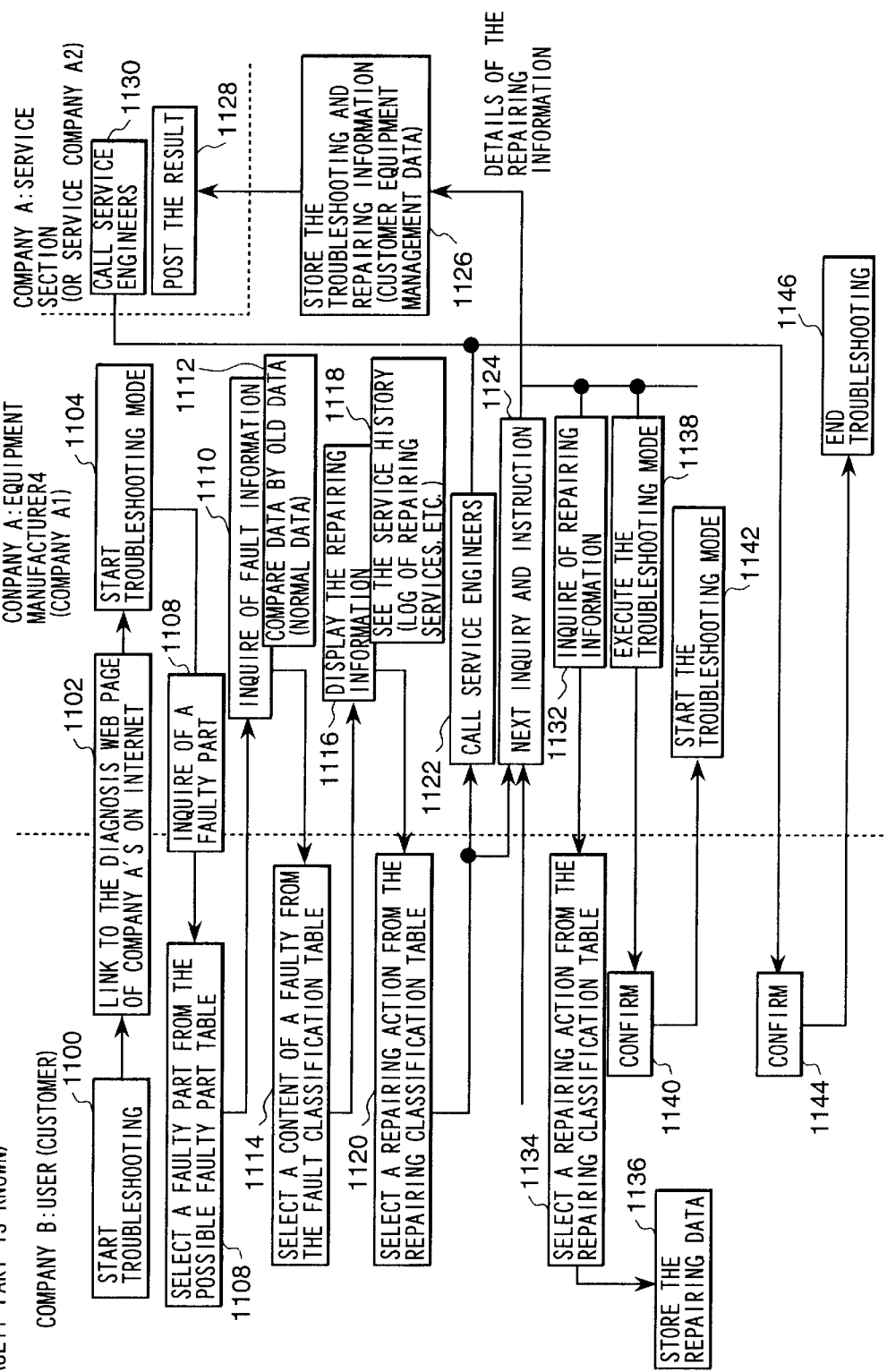
FIG. 12 is a flow diagram of processing for diagnosis of semiconductor manufacturing equipment in the troubleshooting mode.

Next, referring to FIG. 12, an explanation will be given of a troubleshooting mode to be carried out by the troubleshooting equipment 110 in the semiconductor manufacturing equipment when a possibly faulty part of the equipment is known to some extent. When the semiconductor manufacturing equipment of a user (Company B to Company N) has a problem, the user accesses the server of the equipment manufacturer A to request it to diagnose the equipment. With this, the troubleshooting mode program starts (1100 to 1104). When this program starts, the diagnostic equipment asks the user where the semiconductor manufacturing equipment has a problem (1106). The user selects a possible faulty part from a troubleshooting table and sends the requested data to the manufacturer A through the server and the Internet (1108 to 1110). The data is stored in the periodic diagnosis database of the diagnostic equipment. The diagnostic equipment refers to the data of the faulty part and the history of repair of the equipment, and displays information concerning repair (1116). The user selects an optimum type of repair from the troubleshooting table (1120).

The diagnostic equipment calls the service engineer (1122), and makes the next inquiry and indication (1124). At the same time, information of the problem and information concerning the repair are sent to the service section (or service maintenance company A2) (1126). According to these pieces of information, the service section (or service maintenance company A2) takes proper action and executes the troubleshooting mode program (1128 to 1138). The user selects repair items from the troubleshooting table and saves them in memory (1134 and 1136). The diagnostic equipment starts the troubleshooting mode with the user consent if necessary (1140 and 1142). When terminating the diagnosis, the diagnostic equipment deletes the analytic data and terminates the troubleshooting procedure with the user's consent (1144 to 1148).

Figure 13:
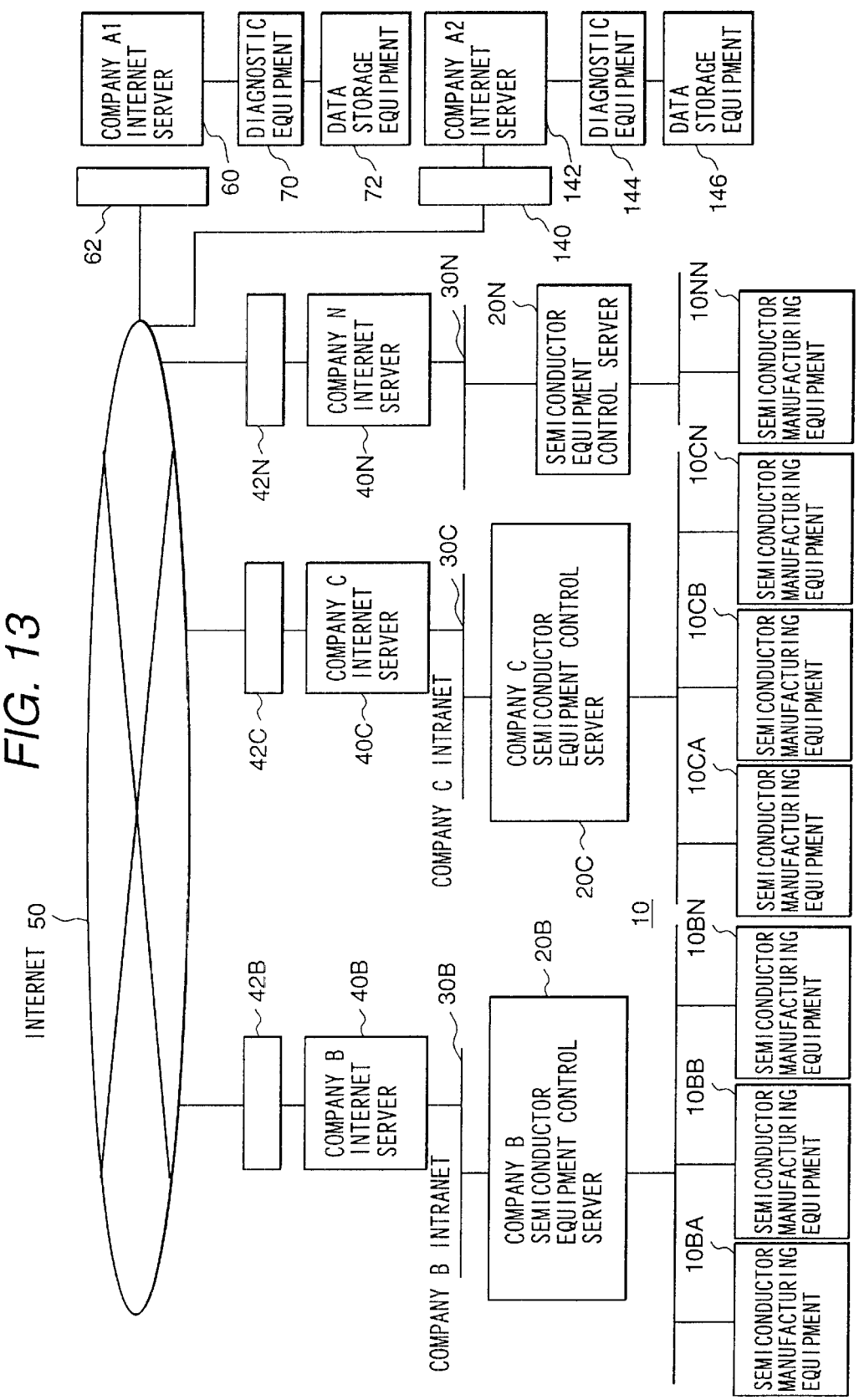
FIG. 13 is a schematic block diagram of a remote diagnostic system for diagnosis of semiconductor manufacturing equipment, which system represents a second preferred embodiment of the present invention.

In the embodiment of FIG. 13, the diagnostic equipment of Company A is installed in both one equipment manufacturer A1 and its contracting maintenance service company (or companies) A2.

The user can select the manufacturer A1 or the maintenance service company A2 for contract of diagnosis in the contract of purchase between the user and the manufacturer (or a distributor (not visible in FIG. 13)). The succeeding connections of this embodiment are the same as those of the above embodiment.

The server of Company A1 and the server of Company A2 can basically communicate with each other for diagnostic data and store their results of diagnoses in a common database.

The user and the manufacturer use diagnostic programs of the same latest version and analytic databases of the same latest version.

Figure 14:
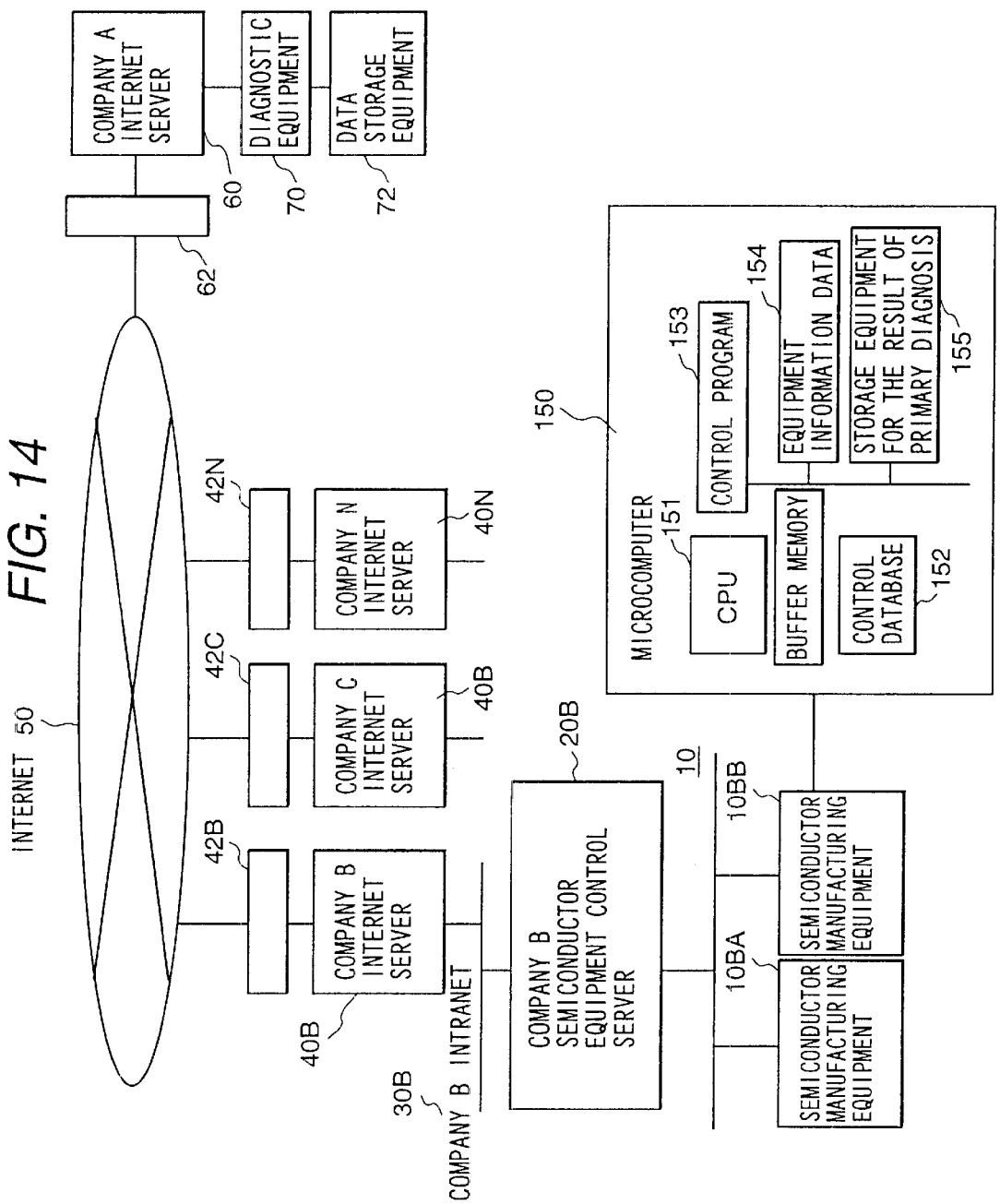
FIG. 14 is a schematic block diagram of a remote diagnostic system for diagnosis of semiconductor manufacturing equipment, which system represents a third preferred embodiment of the present invention.

The embodiment of FIG. 14 has a primary diagnostic data storage area in the server and the semiconductor manufacturing equipment of each user. Company A is not allowed to access these primary diagnostic data storage areas. The users need not pay any attention to accessing by Company A. The users can use these areas freely with the data kept there. The users are prohibited to transfer confidential data, except non-confidential diagnostic result data, to Company A. This is the user's duty to protect signed on contract. In this case, it is preferable and possible to install the diagnostic software on the user's side. With this, each user can protect remote diagnosis information and prevent economic losses.

Another embodiment of the present invention will be explained, in which the user must pay when accessing the diagnostic equipment. The use of this fee-based contract system can ease the economic burden on the developer of higher diagnostic software. Further, this enables the users to use highly analytical data and perform diagnoses of higher reliability.

There are three types of fee-based contracts as shown below.

1) Company A (as an equipment manufacturer) sells Company B (as the user) a right to use the diagnostic equipment (including hardware and software). Company B uses the diagnostic equipment to diagnose Company B's semiconductor equipment.

2) In the above fee-based contract 1), Company B accesses the diagnostic equipment installed in Company A through a communication network.

3) In the above fee-based contract 1), Company B accesses the diagnostic equipment loaned from Company A through an intranet (MES etc.) of Company B.

Figure 15:
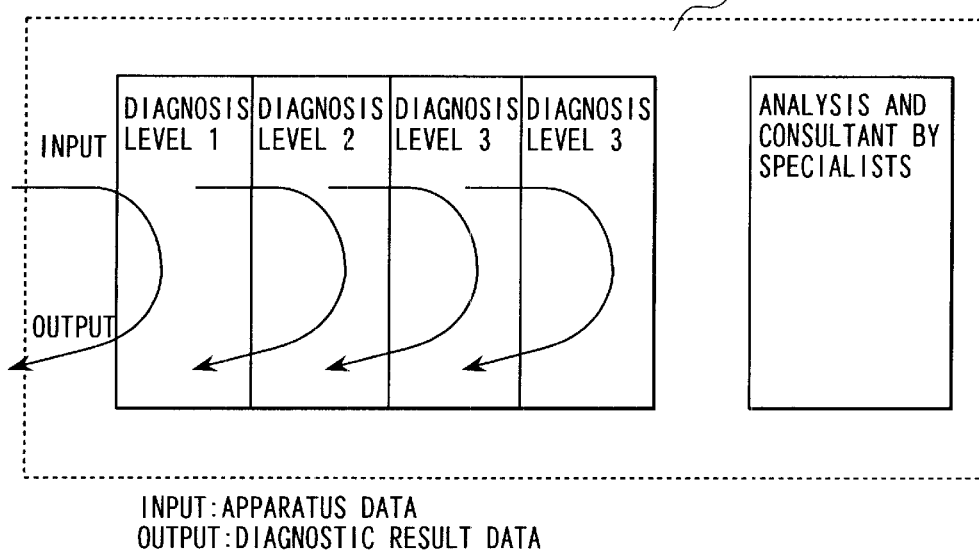
FIG. 15 is a block diagram of a remote diagnostic system for diagnosis of semiconductor manufacturing equipment, which system represents a fourth preferred embodiment of the present invention.

The diagnostic equipment of the diagnostic system of FIG. 15, which is an embodiment of the present invention, has diagnosis levels 1 to N. Company B pays Company A for accessing the diagnostic equipment and diagnosing at higher levels. Further, in this diagnosing system, the highest-level diagnosis can contain analysis and consultation by professionals of Company A. Furthermore, when Company B tries to perform a diagnosis of a higher level with the permission of Company A, the system can be so constructed that the input and output data in the preceding level may be automatically disclosed to Company A. Alternatively, the diagnosis of the lowest level can be offered free of charge. Simple periodic diagnosis services can be offered.

Figure 16:
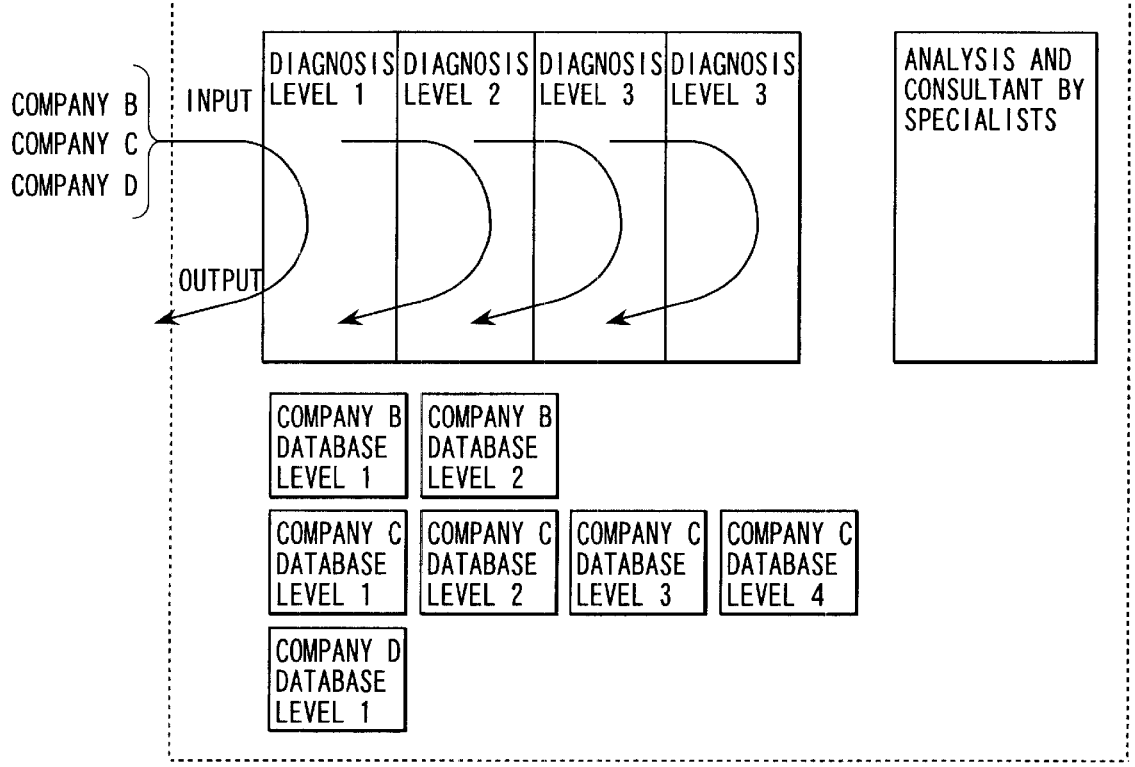
FIG. 16 is a block diagram of a remote diagnostic system for diagnosis of semiconductor manufacturing equipment, which system represents a fifth preferred embodiment of the present invention.

Further, as shown in the diagnosing system of FIG. 16, which is an embodiment of the present invention, the input and output data of respective users (Company B, Company C, and Company D) at each diagnosis level can be stored as a database in the diagnostic equipment 70 so that Company A may access the database of each company with the access permission from the company. Furthermore, in this diagnosing system, when Company B discloses its database to Company A, the rate of using the diagnostic equipment can be reduced according to the degree of the disclosure.

Figure 17:
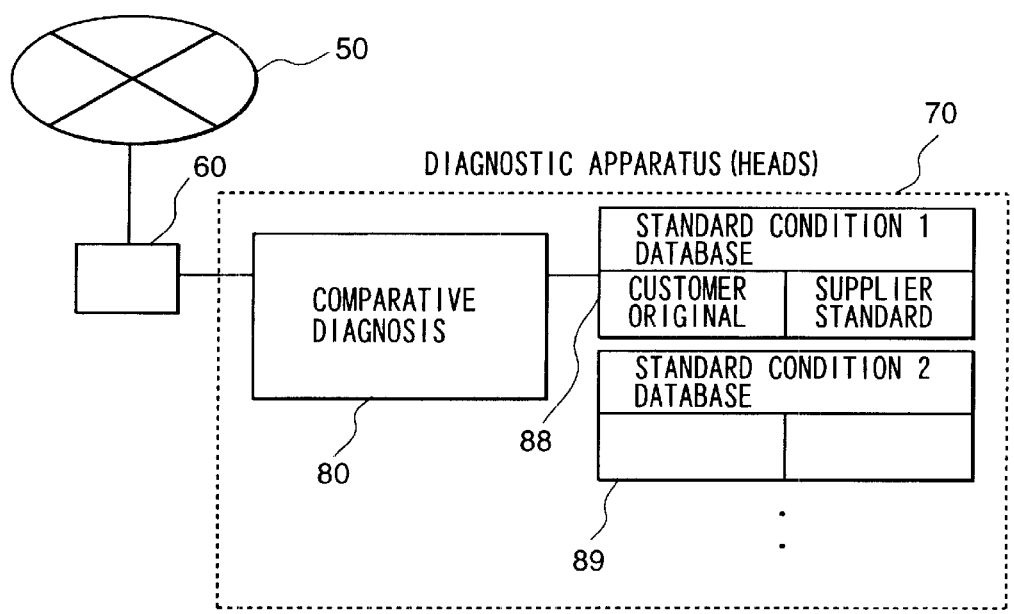
FIG. 17 is a schematic block diagram of a remote diagnostic system for diagnosis of semiconductor manufacturing equipment, which system represents a sixth preferred embodiment of the present invention.

Further, as shown in the diagnosing system of FIG. 17, which is an embodiment of the present invention, it is possible to determine standard operating conditions of the semiconductor manufacturing equipment 10, create databases 88 and 89 under the operating conditions, run the target semiconductor manufacturing equipment which Company A delivered to a device manufacturer under the standard condition, load the diagnostic equipment 70 with the operating data automatically or manually by engineers of the device manufacturer, compare the obtained operating data by the content of said database, and thus diagnose the status of the equipment.

To prevent user's recipe information from being leaked to the supplier of the diagnostic equipment 70, it is possible to contract to use the diagnostic equipment 70 and operation databases which the supplier of the semiconductor manufacturing equipment 10, that is, Company A created according to the result of actual running before shipment, load the semiconductor manufacturing equipment 10 with the user's equipment data after the contract or at the startup of the equipment 10 after the equipment 10 is installed on the user's site, and to use as user's original database.

Data of previous diagnostic services of Company B by Company A or other maintenance service companies is stored in the Company B database of the diagnostic equipment and is used for diagnosis. However, this database is not included in the minimum diagnosis level of FIG. 15. It can be offered to Company B by Company A upon Company B's request.

Figure 18:
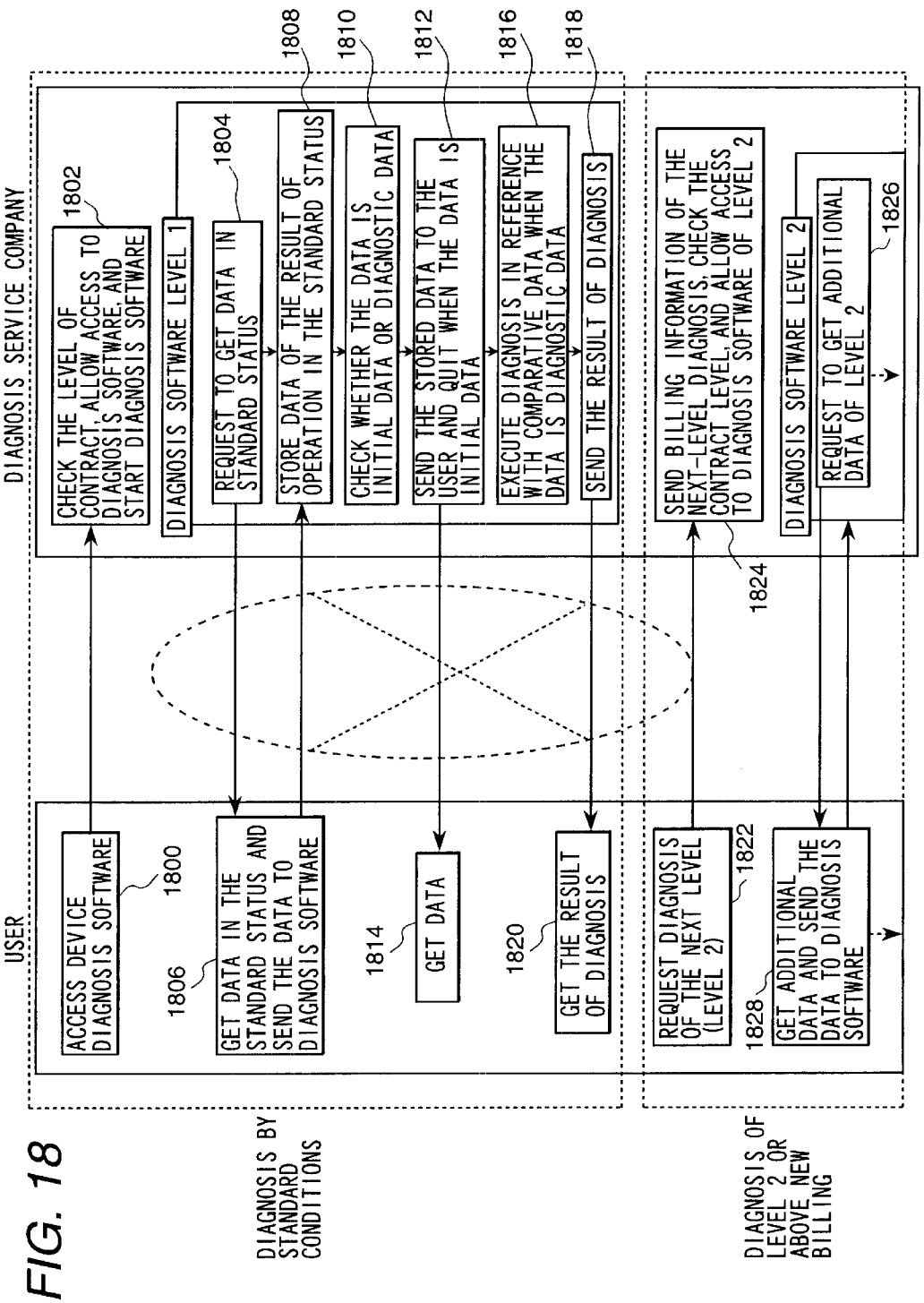
FIG. 18 is a diagram which shows process flows of the remote diagnosing systems of FIG. 15 through FIG. 17.

FIG. 18 shows a process flow of an fee-based contract system of FIG. 15 to FIG. 17 which charges the user for accessing the diagnostic equipment.

The user (contractor) for diagnoses accesses the diagnostic software 70 (1800). The software 70 checks the contract level and starts to run (1802).

The diagnostic software requests the contractor to load standard operation data (1804). The user runs the semiconductor manufacturing equipment under the standard condition, collects data and sends the data to the diagnostic software (1806). This operation can be replaced by the steps of automatically starting the semiconductor manufacturing equipment with permission from the diagnostic software and automatically loading data. The diagnostic software 70 stores the data in the database (1808), and checks whether the data is initial data or data for comparative diagnosis (1810). When the obtained data is for comparative diagnosis, the software compares the data with the content of the database and sends the result to the user (1812 to 1820).

The user goes to the next step according to the result.

When the user requires a diagnosis of a next level, the diagnosis system charges the user according to the requested level and starts the diagnostic software of that level (1822). At the requested level, the diagnostic software requests the user to send additional data if necessary, loads the data, and performs a diagnosis (1824 to 1828).

Figure 19:
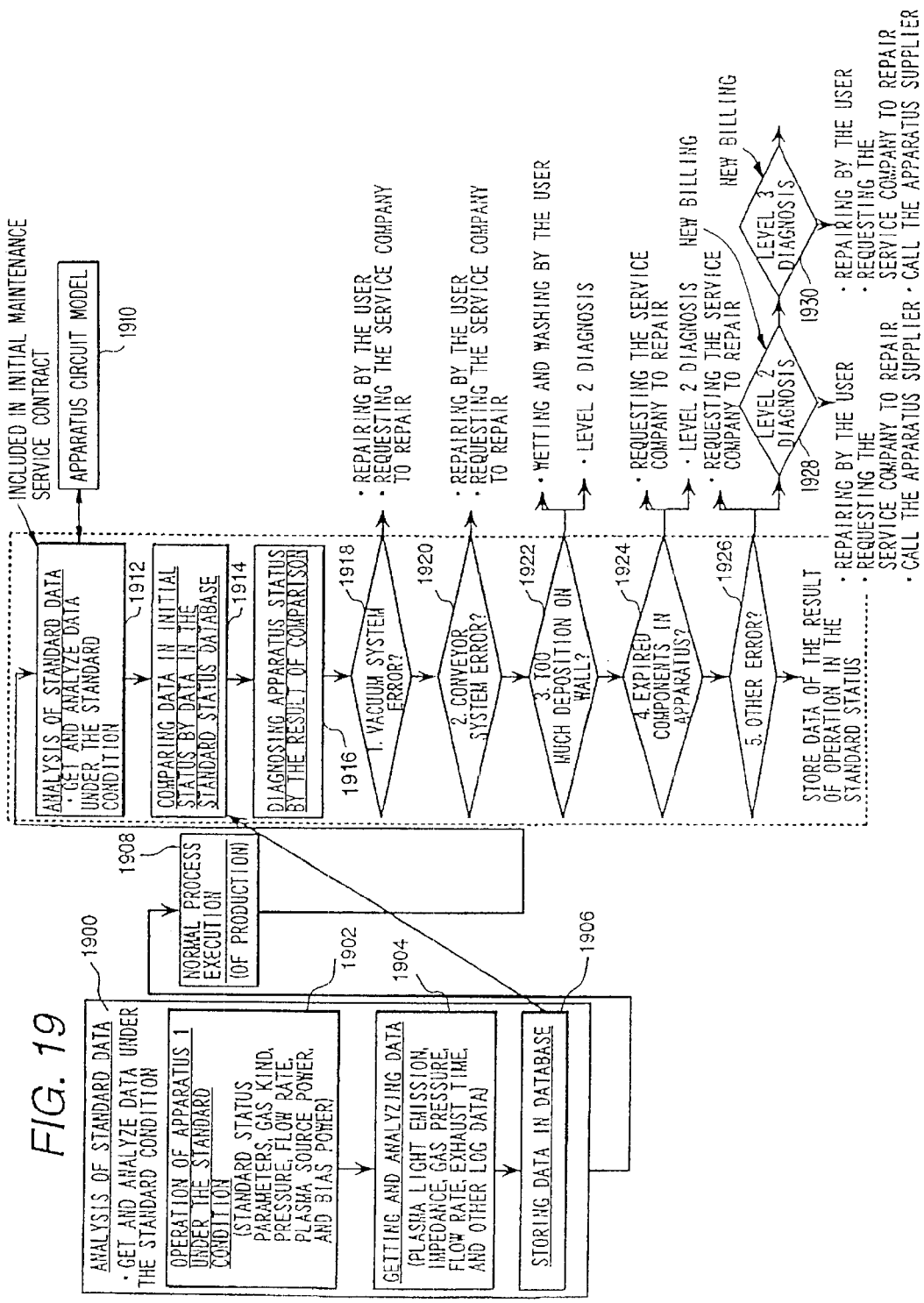
FIG. 19 is a detailed process flow diagram of a diagnosis in the initial level of FIG. 18.

A concrete example of said diagnosing method is illustrated in FIG. 19. This example is assumed to be contained in general diagnostic items of the initial level. This method comprises the steps of analyzing data in the standard status, storing the data in a database (1900 to 1906), carrying out normal processes (1908), analyzing and diagnosing the equipment according to the standard data (1912 to 1926), charging the user according to the requested diagnosis level when the user requires a diagnosis of a next level and starting the diagnostic software of the requested level (1928 to 1930), requesting the user to send additional data if necessary, loading the data, and performing a diagnosis (corresponding to 1826 to 1828 in FIG. 18).

Figure 20:
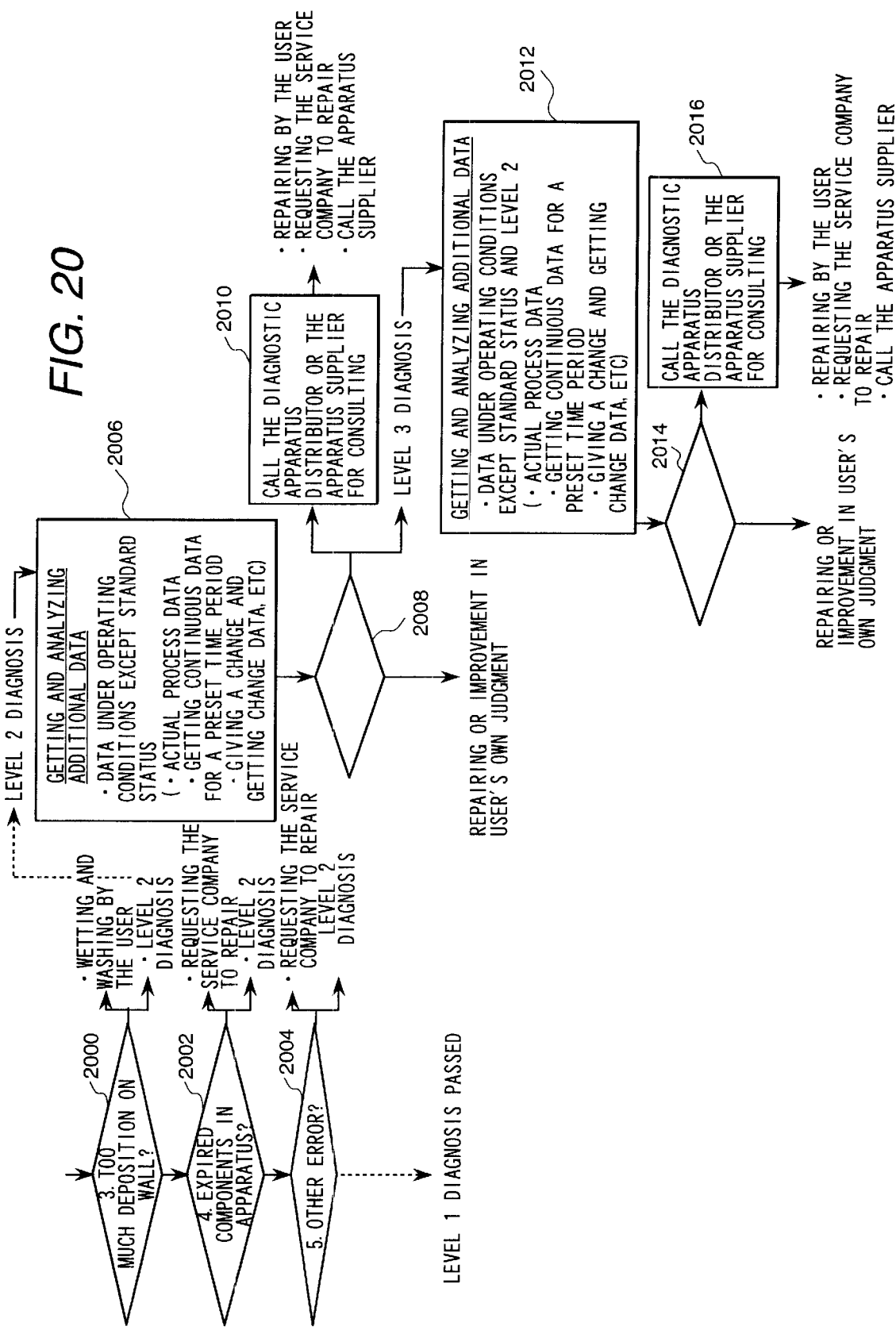
FIG. 20 is a sample process flow diagram of a diagnosis of FIG. 18 to a higher level.

Further, FIG. 20 shows an example of moving to higher diagnosis levels, such as level 2 (2000 to 2010) and level 3 (2012 to 2016).

Figure 21:
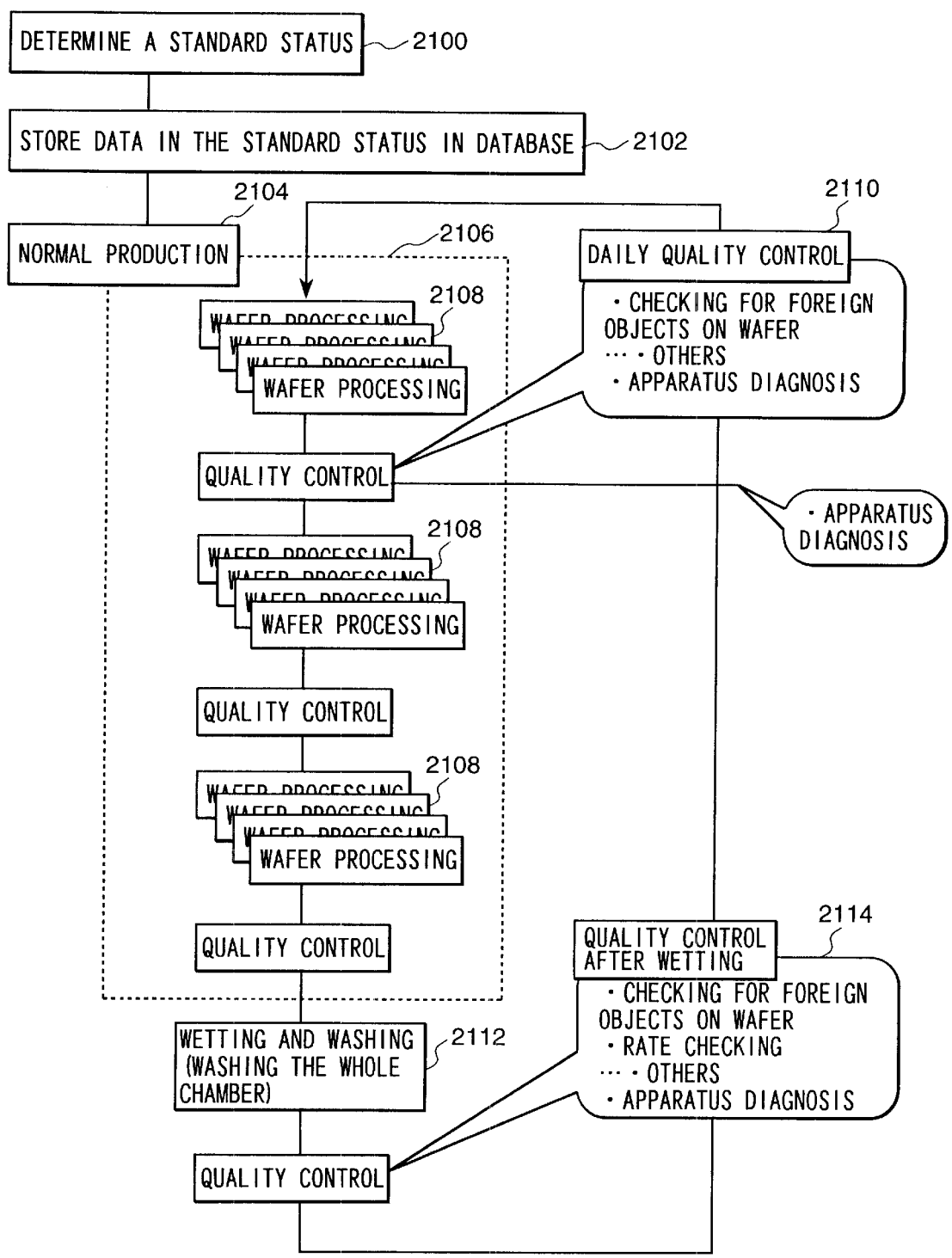
FIG. 21 is a diagram which shows an example of diagnosing semiconductor manufacturing equipment remote diagnostic system of FIG. 15 to FIG. 17.

FIG. 21 shows an example of running the semiconductor manufacturing equipment while executing such diagnoses. This method comprises the steps of obtaining data under standard conditions (2100 to 2102), storing the data in the diagnostic equipment 70, and running the semiconductor manufacturing equipment 10 for normal production (2104 to 2108). Processing for the normal production contains daily quality control operations which are carried almost every day (2110), and wet-washing or whole cleaning (disassembly and cleaning) to remove deposits in the process chamber after a preset number of wafers are processed (2112).

When the daily quality control operation contains the diagnosis in accordance with the present invention, the accurate equipment status control is enabled. The conventional quality control for foreign objects which uses dummy wafers requires much time before the operation data is obtained.

On the contrary, the equipment diagnosing method in accordance with the present invention enables collection of information of deposits on the inner walls of the process chamber without disassembling the equipment and also enables online diagnosis of the equipment. Therefore, the operator can obtain the equipment status more accurately and in less time.

It is assumed that a standard-status operation for diagnosis in accordance with the present invention inserted between normal wafer processing steps will affect the succeeding process steps. In such a case, an additional process step, such as aging, is required before an actual process starts after a diagnosis is started. To prevent such a problem, the interval of the diagnosis can be made longer (e.g. 3 days or one week) before the throughput is affected. It is always required to add a device diagnosis after wet-washing to check whether the equipment is initialized (2114).

When the aforesaid diagnosing method is executed on the semiconductor manufacturing equipment, the result belongs to the user. However, it is very important that the result is not shared by others. That is, all data sent to the user from the diagnostic equipment must be protected. For protection of data, it is preferable to assign an ID to each piece of data, electronically watermark it and thus copyright it.

The above embodiments are all in accordance with the present invention, but are not intended as a definition of the limits of the invention. For example, this invention is widely applicable to diagnoses of facilities, such as production facilities of chemical plants and car production lines, to which both facility users and different cooperating companies join and whose confidential information the users have.

The present invention can provide a remote diagnostic system and a method thereof which aim to achieve both high security of information and prevention of economic losses in remote diagnosis of facilities. Further, the present invention can provide an environment which can present diagnostic programs of higher function and higher quality to the user even after the facilities are installed.

Furthermore, the present invention can provide a remote diagnostic system and a method thereof which can estimate possible failures in the system in advance, and take some steps before they actually occur so as to reduce the economic losses.

The present invention can provide a remote diagnostic system and a method thereof which enables the users to carry out high reliability diagnoses using highly analytical data and further eases the economic burden on the developer of the diagnostic software.

What is claimed is:

1. A remote diagnostic system for semiconductor manufacturing equipment which diagnoses a user's semiconductor manufacturing equipment connected together with a terminal to a piece of diagnostic equipment which is provided by a third party through a communication network;
    wherein the diagnostic equipment includes
        at least one diagnostic program which diagnoses the semiconductor manufacturing equipment, and
        a control section which starts at least one diagnostic program of the at least one diagnostic program when accessed by a specific user terminal given an access right;
    wherein a specific user terminal having an access right to use the diagnostic equipment given by a specific third party for a charge sends data which is requested by the diagnostic equipment for diagnosis and receives a result of diagnosis from the diagnostic equipment; and
    wherein the diagnostic equipment diagnoses the status of the semiconductor manufacturing equipment by
        determining standard operating conditions of the semiconductor manufacturing equipment,
        creating at least one database under the standard operating conditions,
        running the semiconductor manufacturing equipment under the standard operating conditions to obtain operating data, loading the diagnostic equipment with the operating data automatically or in response to an input from the specific user terminal, and comparing the operating data with contents of at least one database of the at least one database.

2. A remote diagnostic system for semiconductor manufacturing equipment which diagnoses semiconductor manufacturing equipment connected to a piece of diagnostic equipment which is provided by a third party through a communication network;

wherein the diagnostic equipment includes
a plurality of diagnostic programs which diagnose the semiconductor manufacturing equipment,
a control section which starts at least one diagnostic program of the plurality of diagnostic programs when accessed by a specific user given an access right to use the diagnostic equipment by a specific third party for a charge, and
a guidance section which displays information about the plurality of diagnostic programs; and wherein the diagnostic equipment diagnoses the status of the semiconductor manufacturing equipment by
determining standard operating conditions of the semiconductor manufacturing equipment,
creating at least one database under the standard operating conditions,
running the semiconductor manufacturing equipment under the standard operating conditions to obtain operating data,
loading the diagnostic equipment with the operating data automatically or in response an input from the specific user, and
comparing the operating data with contents of at least one database of the at least one database.

3. A remote diagnostic system for semiconductor manufacturing equipment according to claim 2, wherein the diagnostic equipment is constructed so that the specific third party cannot refer to input data and output data of the diagnostic equipment without permission from the specific user.

4. A remote diagnostic system for semiconductor manufacturing equipment according to claim 2, wherein the diagnostic equipment is constructed so that the specific third party cannot refer to input data which was input to the diagnostic equipment without permission from the specific user, but can refer to output data which is output from the diagnostic equipment without permission from the specific user.

5. A remote diagnostic system for semiconductor manufacturing equipment according to claim 2, wherein the diagnostic equipment provides a plurality of diagnosis levels; and wherein the specific user can carry out a diagnosis of a higher diagnosis level of the plurality of diagnosis levels than a lowest diagnosis level of the plurality of diagnosis levels for a charge with permission from the specific third party which provides the diagnostic equipment.

6. A remote diagnostic system for semiconductor manufacturing equipment according to claim 5, wherein a highest diagnosis level of the plurality of diagnosis levels may include analysis and consultation by professionals of the specific third party.

7. A remote diagnostic system for semiconductor manufacturing equipment according to claim 6, wherein each diagnosis level of the plurality of diagnosis levels higher than the lowest diagnosis level is constructed so that input data and output data of the diagnostic equipment at an immediately lower diagnosis level of the plurality of diagnosis levels may be automatically disclosed to the specific third party when the specific user carries out a diagnosis of a diagnosis level of the plurality of diagnosis levels higher than the lowest diagnosis level with permission from the specific third party.

8. A remote diagnostic system for semiconductor manufacturing equipment according to claim 5, wherein input data and output data of the diagnostic equipment for each specific user at each diagnosis level of the plurality of diagnosis levels is stored as a database of the specific user in the diagnostic equipment; and wherein the specific third party can access the database of each specific user with permission from the specific user.

9. A remote diagnostic system for semiconductor manufacturing equipment according to claim 5, wherein the semiconductor manufacturing equipment is constructed so that when the specific user discloses a database of input data and output data of the diagnostic equipment for the specific user to the specific third party, the charge for the specific user to use the diagnostic equipment is reduced according to a degree of the disclosure by the specific user.

* * * * *